United States Patent
Ono et al.

(10) Patent No.: US 8,877,526 B2
(45) Date of Patent: Nov. 4, 2014

(54) SEMICONDUCTOR LIGHT EMITTING DEVICE AND METHOD FOR MANUFACTURING THE SAME

(71) Applicant: Kabushiki Kaisha Toshiba, Minato-ku (JP)

(72) Inventors: Hiroshi Ono, Kanagawa-ken (JP); Toshiki Hikosaka, Kanagawa-ken (JP); Tomoko Morioka, Kanagawa-ken (JP); Toshiyuki Oka, Kanagawa-ken (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/834,164

(22) Filed: Mar. 15, 2013

(65) Prior Publication Data
US 2013/0203192 A1 Aug. 8, 2013

Related U.S. Application Data

(62) Division of application No. 13/208,658, filed on Aug. 12, 2011, now Pat. No. 8,461,611.

(30) Foreign Application Priority Data

Dec. 7, 2010 (JP) .................................. 2010-272585

(51) Int. Cl.
*H01L 33/22* (2010.01)
*H01L 33/20* (2010.01)

(52) U.S. Cl.
CPC .............. *H01L 33/22* (2013.01); *H01L 33/20* (2013.01)
USPC .......................................................... 438/20

(58) Field of Classification Search
None
See application file for complete search history.

(56) References Cited

U.S. PATENT DOCUMENTS

| 6,316,785 B1 | 11/2001 | Nunoue et al. |
| 2007/0065960 A1* | 3/2007 | Fukshima et al. .............. 438/42 |

(Continued)

FOREIGN PATENT DOCUMENTS

| JP | 2007-311784 A | 11/2007 |
| JP | 2009-242130 A | 10/2009 |

OTHER PUBLICATIONS

Office Action issued on Jan. 30, 2014 in the counterpart Japanese Patent Application No. 2013-112339 (with English Translation).

(Continued)

*Primary Examiner* — W. Wendy Kuo
*Assistant Examiner* — Herve Assouman
(74) *Attorney, Agent, or Firm* — Oblon, Spivak, McClelland, Maier & Neustadt, L.L.P.

(57) ABSTRACT

According to one embodiment, a semiconductor light emitting device includes a first semiconductor layer, a second semiconductor layer and a light emitting part. The first semiconductor layer includes an n-type semiconductor layer. The second semiconductor layer includes a p-type semiconductor layer. The light emitting part is provided between the first semiconductor layer and the second semiconductor layer, and includes a plurality of barrier layers and a well layer provided between the plurality of barrier layers. The first semiconductor layer has a first irregularity and a second irregularity. The first irregularity is provided on a first major surface of the first semiconductor layer on an opposite side to the light emitting part. The second irregularity is provided on a bottom face and a top face of the first irregularity, and has a level difference smaller than a level difference between the bottom face and the top face.

10 Claims, 25 Drawing Sheets

(56) References Cited

U.S. PATENT DOCUMENTS

| | | | |
|---|---|---|---|
| 2007/0262330 A1* | 11/2007 | Lee et al. | 257/79 |
| 2007/0295981 A1* | 12/2007 | Erchak et al. | 257/98 |
| 2008/0035953 A1* | 2/2008 | Beom et al. | 257/103 |
| 2008/0230793 A1* | 9/2008 | Yoon et al. | 257/94 |
| 2009/0078954 A1 | 3/2009 | Shim et al. | |
| 2010/0181595 A1 | 7/2010 | Oriji et al. | |
| 2011/0127554 A1 | 6/2011 | Lee et al. | |
| 2011/0316041 A1 | 12/2011 | Narita et al. | |
| 2012/0248459 A1 | 10/2012 | Sakano | |

OTHER PUBLICATIONS

Office Action issued Apr. 1, 2013 in Japanese Patent Application No. 2010-272585 with English language translation.
Notification of Reason(s) for Refusal issued Jun. 25, 2013 in Japanese Patent Application No. 2010-272585 (with English translation).
Office Action issued Aug. 4, 2014 in Japanese Patent Application No. 2013-112339 (with English Translation).

* cited by examiner

SEMICONDUCTOR LIGHT EMITTING DEVICE AND METHOD FOR MANUFACTURING THE SAME

CROSS-REFERENCE TO RELATED APPLICATIONS

This application is a division of and claims the benefit of priority under 35 U.S.C. §120 from U.S. Ser. No. 13/208,658 filed Aug. 12, 2011, and claims the benefit of priority under U.S.C. §119 from Japanese Patent Application No. 2010-272585 filed Dec. 7, 2010; the entire contents of each of which are incorporated herein by reference.

FIELD

Embodiments described herein relate generally to a semiconductor light emitting device and a method for manufacturing the same.

BACKGROUND

Semiconductor light emitting devices such as ultraviolet, blue, and green Light Emitting Diodes (LED), or blue-violet and blue Laser Diodes (LDs) have been developed, using nitride semiconductor such as gallium nitride.

In order to enhance efficiency and intensity of semiconductor light emitting devices, it is desired to enhance internal quantum efficiency and light extraction efficiency. It is essential to improve crystal quality of the semiconductor layer in order to enhance internal quantum efficiency. For enhancement of light extraction efficiency, there is a configuration in which a substrate having irregularity is used. There is still room for enhancement to have high crystal quality and high light extraction efficiency at the same time.

DETAILED DESCRIPTION

Figure 1A:
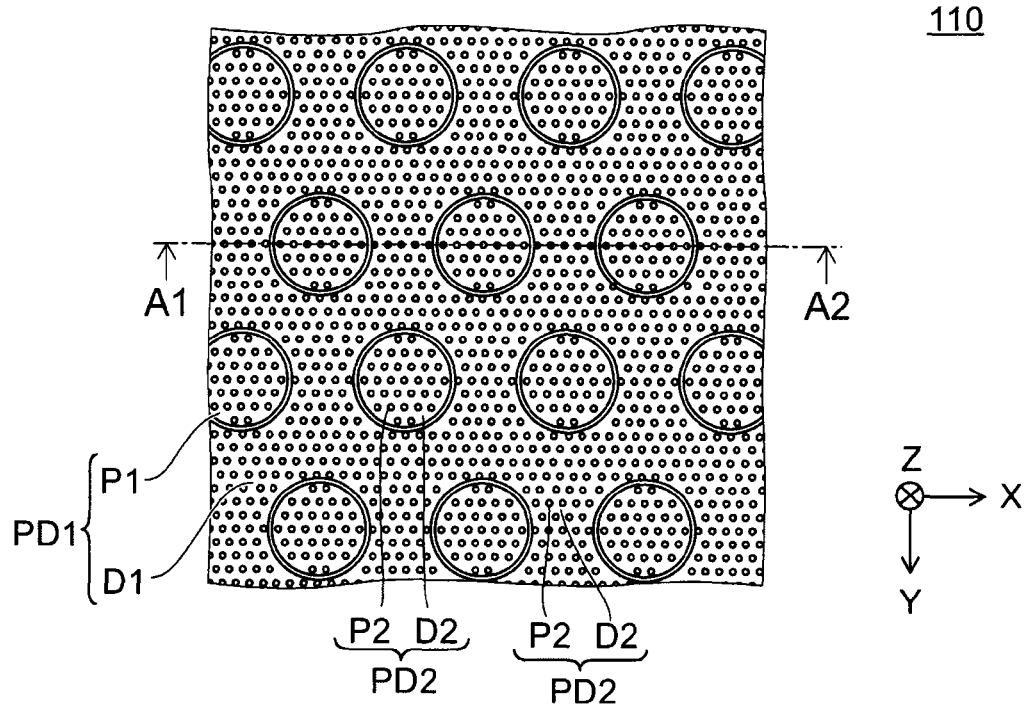
FIG. 1A and FIG. 1B are schematic views showing a semiconductor light emitting device according to a first embodiment.

In general, according to one embodiment, a semiconductor light emitting device includes a first semiconductor layer, a second semiconductor layer and a light emitting part. The first semiconductor layer includes an n-type semiconductor layer. The second semiconductor layer includes a p-type semiconductor layer. The light emitting part is provided between the first semiconductor layer and the second semiconductor layer, and includes a plurality of barrier layers and a well layer provided between the barrier layers. The first semiconductor layer has a first major surface, a first irregularity, and a second irregularity. The first major surface is on an opposite side to the light emitting part. The first irregularity is provided on the first major surface. The first irregularity has a bottom face and a top face. The second irregularity is provided on the bottom face and the top face and has a bottom portion and a top portion. The first irregularity has a first level difference between the bottom face and the top face along a first direction from the first semiconductor layer toward the second semiconductor layer. The second irregularity has a second level difference between the bottom portion and the top portion along the first direction. The second level difference is smaller than the first level difference.

In general, according to another embodiment, a semiconductor light emitting device includes a first semiconductor layer, a second semiconductor layer and a light emitting part. The first semiconductor layer includes an n-type semiconductor layer. The second semiconductor layer includes a p-type semiconductor layer. The light emitting part is provided between the first semiconductor layer and the second semiconductor layer, and includes a plurality of barrier layers and a well layer provided between the barrier layers. The first semiconductor layer has a first major surface on an opposite side to the light emitting part, and an irregularity provided on the first major surface. The irregularity has a step-like side face including a plurality of terrace faces perpendicular to a first direction from the first semiconductor layer toward the second semiconductor layer. The irregularity has a plurality of top portions and a bottom portion provided between the top portions when the first major surface is cut in a plane parallel to the first direction. Widths of the top portions along a second direction connecting the two top portions nearest to each other of the top portions and a width of the bottom portion along the second direction are four times or less widths of the terrace faces along the second direction.

In general, according to another embodiment, a semiconductor light emitting device includes a first semiconductor layer, a second semiconductor layer and a light emitting part. The first semiconductor layer includes an n-type semiconductor layer. The second semiconductor layer includes a p-type semiconductor layer. The light emitting part is provided between the first semiconductor layer and the second semiconductor layer, and includes a plurality of barrier layers and a well layer provided between the barrier layers. The first semiconductor layer has a first major surface on an opposite side to the light emitting part, and an irregularity provided on the first major surface. The irregularity has a step-like side face including a plurality of terrace faces perpendicular to a first direction from the first semiconductor layer toward the second semiconductor layer. The irregularity has a plurality of bottom portions and a top portion provided between the bottom portions when the first major surface is cut in a plane parallel to the first direction. Widths of the bottom portions along a second direction connecting the two bottom portions nearest to each other of the bottom portions and a width of the top portion along the second direction are four times or less than widths of the terrace faces along the second direction.

In general, according to another embodiment, a method is disclosed for manufacturing a semiconductor light emitting device. The device includes: a first semiconductor layer; a second semiconductor layer; and a light emitting part. The first semiconductor layer includes an n-type semiconductor layer. The second semiconductor layer includes a p-type semiconductor layer. The light emitting part is provided between the first semiconductor layer and the second semiconductor layer, and includes a plurality of barrier layers and a well layer provided between the barrier layers. The first semiconductor layer has: a first major surface, a first irregularity, and a second irregularity. The first major surface is on an opposite side to the light emitting part. The first irregularity is provided on the first major surface. The first irregularity has a bottom face and a top face. The second irregularity is provided on the bottom face and the top face and having a bottom portion and a top portion. The first irregularity has a first level difference between the bottom face and the top face along a first direction from the first semiconductor layer toward the second semiconductor layer. The second irregularity has a second level difference between the bottom portion and the top portion along the first direction. The second level difference is smaller than the first level difference. The method can include forming a third irregularity serving as a basis of the second irregularity on a substrate major surface of a substrate. The method can include forming a mask material having a pattern shape corresponding to a pattern of the first irregularity on the substrate major surface on which the third irregularity is formed. The method can include processing the substrate major surface using the mask material as a mask to form a fourth irregularity serving as a basis of the first irregularity. In addition, the method can include forming the first semiconductor layer on the substrate major surface on which the third irregularity and the fourth irregularity have been formed.

In general, according to another embodiment, a method is disclosed for manufacturing a semiconductor light emitting device. The device includes: a first semiconductor layer; a second semiconductor layer; and a light emitting part. The first semiconductor layer includes an n-type semiconductor layer. The second semiconductor layer includes a p-type semiconductor layer. The light emitting part is provided between the first semiconductor layer and the second semiconductor layer, and includes a plurality of barrier layers and a well layer provided between the barrier layers. The first semiconductor layer has a first major surface on an opposite side to the light emitting part, and an irregularity provided on the first major surface. The irregularity has a step-like side face including a plurality of terrace faces perpendicular to a first direction from the first semiconductor layer toward the second semiconductor layer. The method can include performing a substrate processing. The performing substrate processing includes: forming mask material having a plurality of level differences serving as a basis of at least a part of a shape of the plurality of terrace faces on a substrate major surface of a substrate; and processing the substrate major surface using the mask material as a mask. In addition, the method can include forming the first semiconductor layer on the substrate major surface subjected to the performing the substrate processing.

In general, according to another embodiment, a method is disclosed for manufacturing a semiconductor light emitting device. The device includes: a first semiconductor layer; a second semiconductor layer; and a light emitting part. The first semiconductor layer includes an n-type semiconductor layer. The second semiconductor layer includes a p-type semiconductor layer. The light emitting part is provided between the first semiconductor layer and the second semiconductor layer, and includes a plurality of barrier layers and a well layer provided between the barrier layers. The first semiconductor layer has a first major surface on an opposite side to the light emitting part, and an irregularity provided on the first major surface. The irregularity has a step-like side face including a plurality of terrace faces perpendicular to a first direction from the first semiconductor layer toward the second semiconductor layer. The method can include performing a substrate processing. The performing substrate processing includes: forming a mask material having a pattern shape reflecting a shape of the irregularity on a substrate major surface of a substrate; processing the substrate major surface with a first etching material using the mask material as a mask, the first etching material having an etching speed in the first direction higher than an etching speed in a direction perpendicular to the first direction; and processing the substrate major surface with a second etching material using the mask material as a mask, the second etching material having an etching speed in the first direction not more than an etching speed in a direction perpendicular to the first direction. In addition, the method can include forming the first semiconductor layer on the substrate major surface subjected to the performing the substrate processing.

In general, according to another embodiment, a method is disclosed for manufacturing a semiconductor light emitting device. The device includes: a first semiconductor layer; a second semiconductor layer; and a light emitting part. The first semiconductor layer includes an n-type semiconductor layer. The second semiconductor layer includes a p-type semiconductor layer. The light emitting part is provided between the first semiconductor layer and the second semiconductor layer, and includes a plurality of barrier layers and a well layer provided between the barrier layers. The first semiconductor layer has a first major surface on an opposite side to the light emitting part, and an irregularity provided on the first major surface. The irregularity has a step-like side face including a plurality of terrace faces perpendicular to a first direction from the first semiconductor layer toward the second semiconductor layer. The method can include performing a substrate processing. The performing substrate processing including: forming a mask material on a substrate major surface of a substrate; and repeating slimming of the mask material and processing of the substrate major surface using the slimmed mask material as a mask. In addition, the method can include forming the first semiconductor layer on the substrate major surface subjected to the performing the substrate processing.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
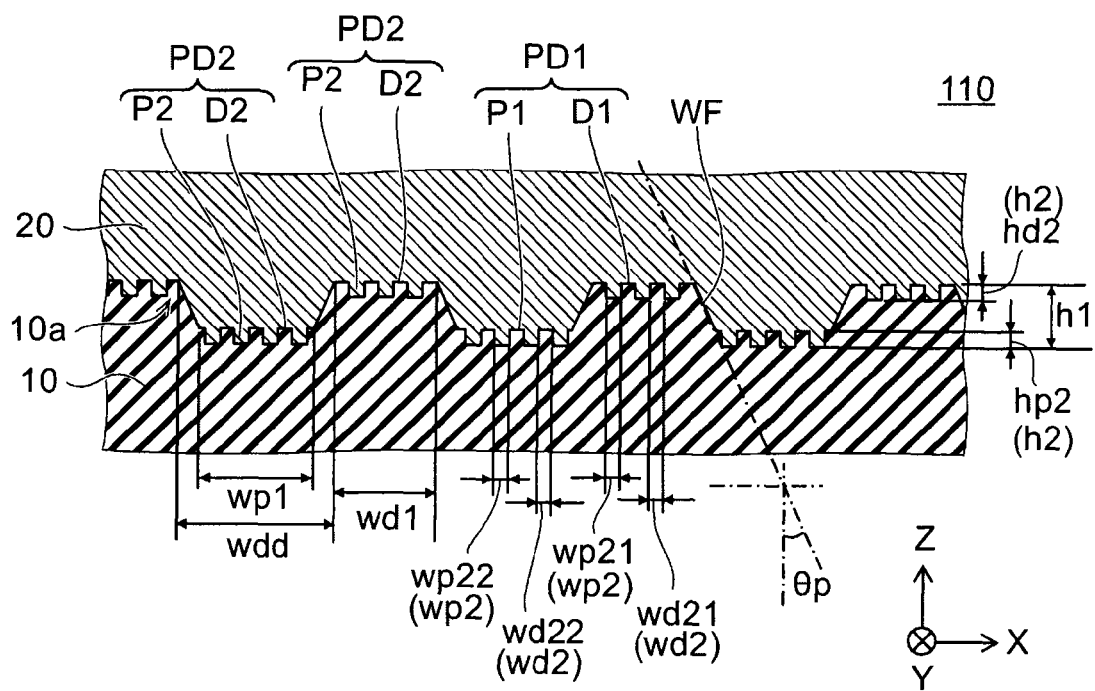

FIG. 1A and FIG. 1B are schematic views illustrating the configuration of a semiconductor light emitting device according to a first embodiment.

Figure 2:
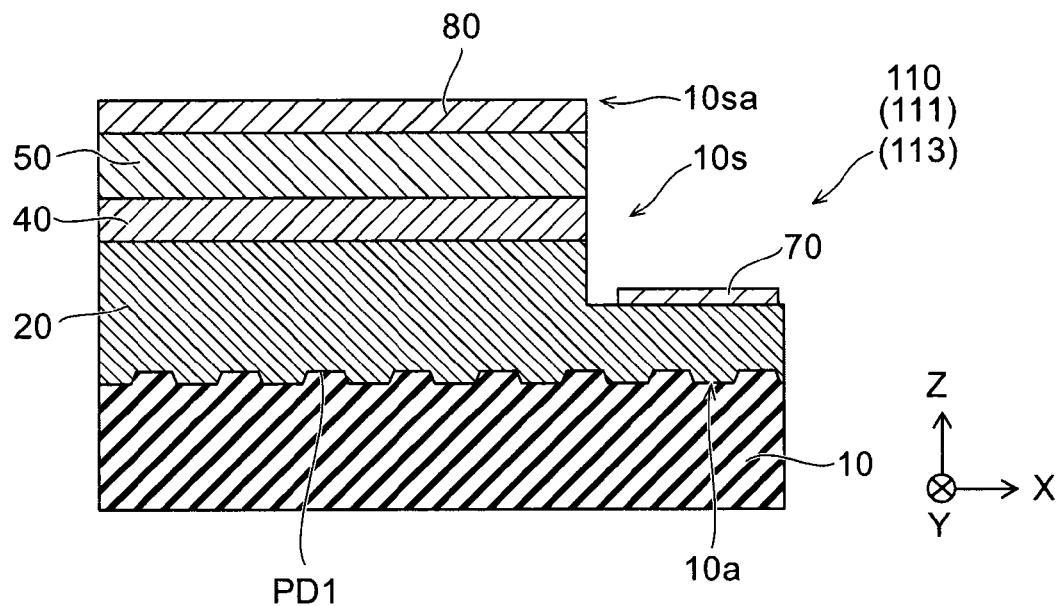
FIG. 2 is a schematic cross-sectional view showing the semiconductor light emitting device according to the embodiment.

FIG. 2 is a schematic cross-sectional view illustrating the configuration of a semiconductor light emitting device according to the embodiment.

Figure 3:
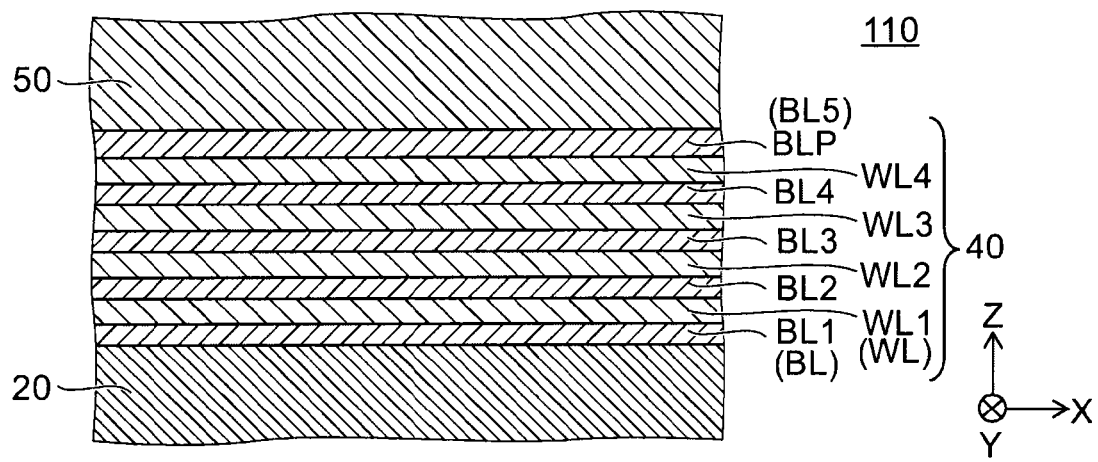
FIG. 3 is a schematic cross-sectional view showing a part of the semiconductor light emitting device according to the embodiment.

FIG. 3 is a schematic cross-sectional view illustrating the configuration of a part of the semiconductor light emitting device according to the embodiment.

Figure 4:
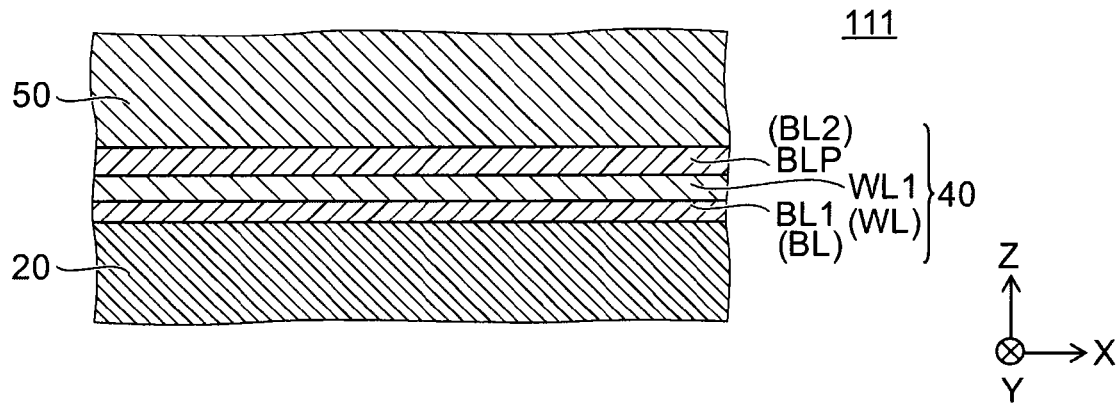
FIG. 4 is a schematic cross-sectional view showing a part of the semiconductor light emitting device according to the embodiment.

FIG. 4 is a schematic cross-sectional view illustrating the configuration of a part of the semiconductor light emitting device according to the embodiment. First, the configuration of the semiconductor light emitting device according to the embodiment will be outlined, referring to FIG. 2.

As shown in FIG. 2, a semiconductor light emitting device 110 according to the embodiment includes a first semiconductor layer 20 including an n-type semiconductor layer, a second semiconductor layer 50 including a p-type semiconductor layer, and a light emitting part 40. The light emitting part 40 is provided between the first semiconductor layer 20 and the second semiconductor layer 50. As will be described below, the light emitting part 40 includes a plurality of barrier layers and a well layer provided between the plurality of barrier layers.

The first semiconductor layer 20 has a first major surface 10a. The first major surface 10a is a surface of the first semiconductor layer 20 on an opposite side to the light emitting part 40. The first major surface 10a is provided with a first irregularity PD1. Description of the first irregularity PD1 will be provided below.

For example, a GaN layer including an n-type impurity is used for the n-type semiconductor layer of the first semiconductor layer 20. At least one of Si, Ge, Te, and Sn may be used as the n-type impurity. The first semiconductor layer 20 includes an n-side contact layer, for example.

For example, a GaN layer including a p-type impurity is used for the p-type semiconductor layer of the second semiconductor layer 50. At least one of Mg, Zn, and C may be used as the p-type impurity. The second semiconductor layer 50 includes a p-side contact layer, for example.

As recited above, the semiconductor light emitting device 110 has provided therein a stacked structure body 10s including the first semiconductor layer 20, the light emitting part 40, and the second semiconductor layer 50. In the example, a part on the side of a first stacked body surface 10sa of the stacked structure body 10s has been selectively removed. Accordingly, a part of the first semiconductor layer 20 is exposed on the side of the first stacked body surface 10sa. Specifically, the n-type semiconductor layer (e.g., n-side contact layer) included in the first semiconductor layer 20 is exposed. An n-side electrode 70 is provided at the exposed part. The n-side electrode 70 contacts the first semiconductor layer 20. For example, a composite film of titanium-platinum-gold (Ti/Pt/Au) is used for the n-side electrode 70.

A p-side electrode 80 contacts the second semiconductor layer 50. Specifically, the p-side electrode 80 contacts the p-type semiconductor layer (e.g., p-side contact layer) of the second semiconductor layer 50. For example, indium tin oxide (ITO) is used for the p-side electrode 80. In addition, a composite film such as nickel-gold (Ni/Au) may be used for the p-side electrode 80.

In the specific example, the semiconductor light emitting device 110 further includes a substrate 10. The first semiconductor layer 20 is provided between the substrate 10 and the light emitting part 40. The substrate 10 may be provided or omitted as necessary.

For example, sapphire is used for the substrate 10. The embodiment is not limited thereto and one of sapphire, GaN, SiC, Si, and GaAs, for example, is used for the substrate 10. In the following, an example will be described in which a sapphire substrate is used for the substrate 10.

The first semiconductor layer 20 is formed on the substrate 10. For example, a buffer layer (not shown in FIG. 2) is formed on the substrate 10. For example, GaN layer is used in the buffer layer. An n-type semiconductor layer is formed on the buffer layer. The buffer layer and the n-type semiconductor layer are included in the first semiconductor layer 20. The light emitting part 40 is formed on the first semiconductor layer 20. The second semiconductor layer 50 is formed on the light emitting part 40. Accordingly, the stacked structure body 10s is formed. The substrate 10 may be removed after formation of the stacked structure body 10s.

Here, a direction from the first semiconductor layer 20 toward the second semiconductor layer 50 is defined as the Z-axis direction (first direction). A direction perpendicular to the Z-axis direction is defined as the X-axis direction. A direction perpendicular to the Z-axis direction and the X-axis direction is defined as the Y-axis direction.

The stacked structure body 10s may further include a multilayer stacked body (not shown). The multilayer stacked body is provided between the buffer layer and the n-side contact layer, for example. In addition, a multilayer structure is provided between the n-side contact layer and the light emitting part 40, for example. The multilayer stacked body includes a plurality of thick film layers and a plurality of thin film layers alternately stacked in the Z-axis direction. The thin film layers are thinner than the thick film layers. The thin film layers have a different composition from that of the thick film layers. The multilayer stacked body has a superlattice structure, for example. The multilayer stacked body includes a nitride semiconductor, for example. The thick film layer includes GaN and the thin film layer includes InGaN, for example. The multilayer stacked body may be provided or omitted as necessary.

FIG. 3 illustrates an exemplary configuration of the light emitting part 40.

As shown in FIG. 3, the light emitting part 40 includes a plurality of barrier layers BL and well layers WL provided between the plurality of barrier layers BL.

In the example, there are four well layers WL. However, the embodiment is not limited thereto. The number of well layers WL is two or more and is arbitrary. In the example, a plurality of well layers WL is provided. In other words, the light emitting part 40 in the specific example has a Multiple Quantum Well (MQW) structure.

The plurality of well layers WL includes a first well layer WL1 to an n-th well layer WLn. Here, "n" is an integer of 2 or larger. For example, an (i+1)-th well layer WL (i+1) is provided between an i-th well layer WLi and the second semiconductor layer 50. Here, "i" is an integer of 1 or larger.

The plurality of barrier layers BL includes a first barrier layer BL1 to an n-th barrier layer BLn. For example, an (i+1)-th barrier layer BL (i+1) is provided between an i-th barrier layer BLi and the second semiconductor layer 50.

It is assumed that the i-th well layer WLi is provided between the i-th barrier layer BLi and the (i+1)-th barrier layer BL (i+1). The barrier layers BL has an (n+1)-th barrier layer BL (n+1). For example, the (n+1)-th barrier layer BL (n+1) is a p-side barrier layer BLP.

FIG. 4 illustrates the configuration of the light emitting part 40 in another semiconductor light emitting device 111 according to the embodiments. Since the configuration of other than the light emitting part 40 in the semiconductor light emitting device 111 is similar to that of the semiconductor light emitting device 110, description thereof is omitted.

In the semiconductor light emitting device 111, as shown in FIG. 4, the light emitting part 40 includes two barrier layers BL and a single well layer WL. As recited above, the light emitting part 40 in the semiconductor light emitting device 111 may have a Single Quantum Well (SQW) structure.

Accordingly, in the embodiment, an MQW structure or an SQW structure is employed.

In the following, the semiconductor light emitting device 110 having an MQW structure will be described. However, the following description can be applied to the semiconductor light emitting device 111 having an SQW structure.

A nitride semiconductor is used for the first semiconductor layer 20, the second semiconductor layer 50, and the light emitting part 40. In other words, the first semiconductor layer 20, the second semiconductor layer 50, and the light emitting part 40 include a nitride semiconductor.

The well layer WL may include InGaN and the barrier layer BL may include GaN. The band gap energy of the material used for the barrier layer BL is larger than the band gap energy of the material used for the well layer WL.

Indium need not be doped in the barrier layer BL. In other words, the barrier layer BL does not substantially include In. The composition ratio of In among the group III elements in the well layer WL is higher than that of In among the group III element in the barrier layer BL. In other words, the composition ratio of In in the barrier layer BL is smaller than that of In of the well layer WL even if the barrier layer BL contains In.

The composition ratio of In among the group III elements in the well layer WL is 0.08 or more and 0.5 or less, for example. In addition, the peak wavelength of the light emitted from the light emitting part 40 is 400 nanometers (nm) or more and 650 nm or less, for example.

FIG. 1A is a plan view seeing the first major surface 10a of the first semiconductor layer 20 in the Z-axis direction. If the substrate 10 is provided in the semiconductor light emitting device 110, FIG. 1A corresponds to a plan view seeing the first major surface 10a through the substrate 10. FIG. 1B is a cross-sectional view taken along the line A1-A2 of FIG. 1A.

As shown in FIG. 1A and FIG. 1B, the first semiconductor layer 20 has the first irregularity PD1 and a second irregularity PD2. In FIG. 2, the second irregularity PD2 is omitted so that the drawing can be seen more easily.

The first irregularity PD1 is provided on the first major surface 10a of the first semiconductor layer 20. The first irregularity PD1 includes a bottom face D1 and a top face P1, for example. The bottom face D1 is the face of a depression of the first irregularity PD1. The top face P1 is the face of a protrusion of the first irregularity PD1. In the example, the bottom face D1 is continuous in the first major surface 10a. In other words, a plurality of protrusions is provided in a continuous region of the depression in the first major surface 10a. In the specific example, the planar shape of the top face P1 is circular. In the example, the protrusion of the first irregularity PD1 is circular truncated cone-shaped. The bottom face D1 and the top face P1 are faces substantially perpendicular to the Z-axis direction.

The second irregularity PD2 is provided in the bottom face D1 and the top face P1 of the first irregularity PD1. The second irregularity PD2 has a smaller level difference than that between the bottom face D1 and the top face P1 of the first irregularity PD1.

As shown in FIG. 1B, the level difference between the bottom face D1 and the top face P1 of the first irregularity PD1 is a first height h1.

The level difference between the bottom portion and the top portion of the second irregularity PD2 provided on the bottom face D1 is a bottom face second height hd2. The level difference between the bottom portion and the top portion of the second irregularity PD2 provided on the top face P1 is a top face second height hp2. The bottom face second height hd2 is smaller than the first height h1. The top face second height hp2 is smaller than the first height h1.

For example, the bottom face second height hd2 is equal to the top face second height hp2. Alternatively, the bottom face second height hd2 may be different from the top face second height hp2. In the following, for simplicity, description is provided assuming that the bottom face second height hd2 and the top face second height hp2 are a second height h2.

In the embodiment, the first irregularity PD1 and the second irregularity PD2 of the first semiconductor layer 20 mentioned above are provided, for example, by forming the first semiconductor layer 20 on the substrate 10 having an irregular shape corresponding to the first irregularity PD1 and the second irregularity PD2. In other words, the first semiconductor layer 20 is formed on the substrate 10 by crystal growth.

The level difference of the first irregularity PD1 (first height h1) and that of the second irregularity PD2 (second height h2) correspond, for example, to the level difference provided on the substrate 10.

In the semiconductor light emitting device 110 according to the embodiments, as recited above, the second irregularity PD2 having a small level difference is provided on each of the bottom face D1 and the top face P1 of the first irregularity PD1. Accordingly, a semiconductor light emitting device having a high crystal quality and a high light extraction efficiency can be obtained.

In other words, light extraction efficiency can be enhanced without degrading crystal growth characteristic of the first semiconductor layer 20 on the substrate 10, according to the embodiments.

Figure 5A:
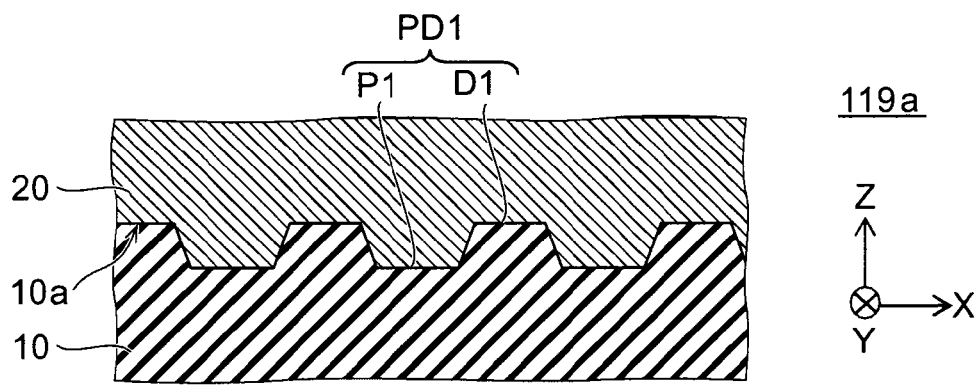
FIG. 5A and FIG. 5B are schematic cross-sectional views showing semiconductor light emitting devices of reference examples.
Figure 5B:
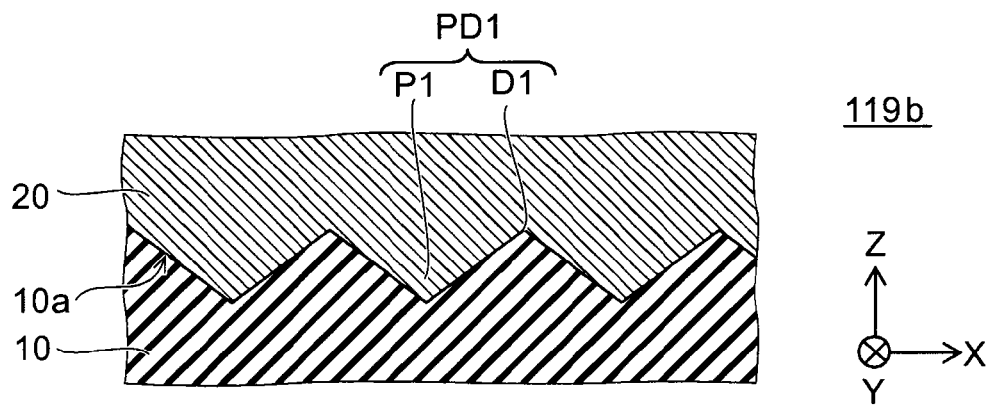

The configuration of such an embodiment has been obtained through the following considerations:

FIG. 5A and FIG. 5B are schematic cross-sectional views illustrating the configuration of the semiconductor light emitting devices of reference examples.

As shown in FIG. 5A, although the first irregularity PD1 is provided in a semiconductor light emitting device 119a of the first reference example, the second irregularity PD2 is not provided. The depression of the first irregularity PD1 has a planar part and the protrusion has a planar part. In other words, the first irregularity PD1 has the bottom face D1 and the top face P1. The bottom face D1 and the top face P1 are planes which are substantially perpendicular to the Z-axis direction.

On the other hand, as shown in FIG. 5B, although the first irregularity PD1 is provided in a semiconductor light emitting device 119b of the second reference example, the second irregularity PD2 is not provided. The first irregularity PD1 does not have the bottom face D1 and the top face P1 which are substantially perpendicular to the Z-axis direction. In other words, only a slope inclined with respect to the Z-axis direction is provided in the first irregularity PD1.

The first irregularity PD1 of the first semiconductor layer as described above is provided by forming the first semiconductor layer 20 on the surface of the substrate 10 having an irregular shape corresponding to the first irregularity PD1.

According to experiments by the inventors, it has been found that, although crystal quality of the first semiconductor layer 20 formed on the substrate 10 is high in the semiconductor light emitting device 119a, the crystal quality is low in the semiconductor light emitting device 119b. For example, in the semiconductor light emitting device 119b, a void may easily occur on the first semiconductor layer 20. A pit may easily occur in the semiconductor light emitting device 119b. On the other hand, it has been found that, although light extraction efficiency is low in the semiconductor light emitting device 119a, light extraction efficiency is high in the semiconductor light emitting device 119b.

It has been found that there is a trade-off between light extraction efficiency and crystal quality. The inventors have analyzed crystal quality and light extraction efficiency by experiments and simulations.

Figure 6A:
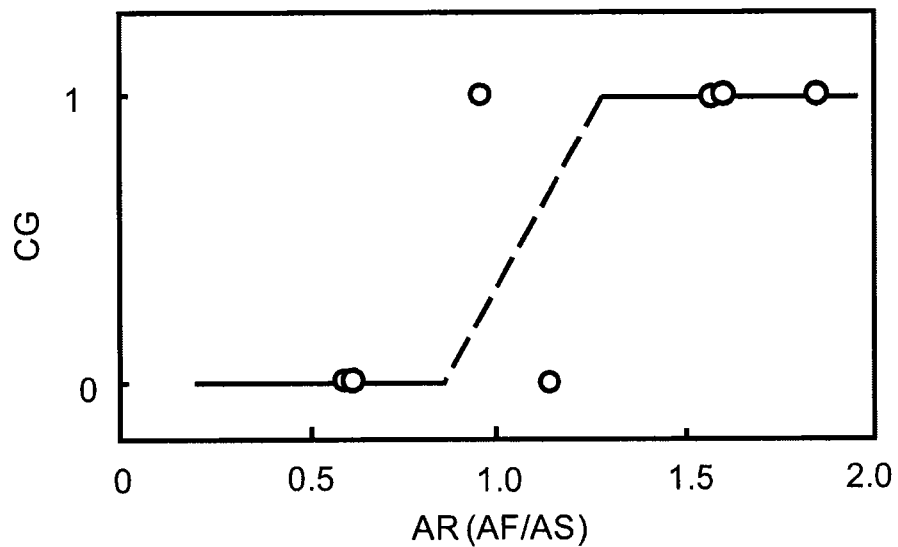
FIG. 6A and FIG. 6B are graphs showing characteristics of a semiconductor light emitting device.
Figure 6B:
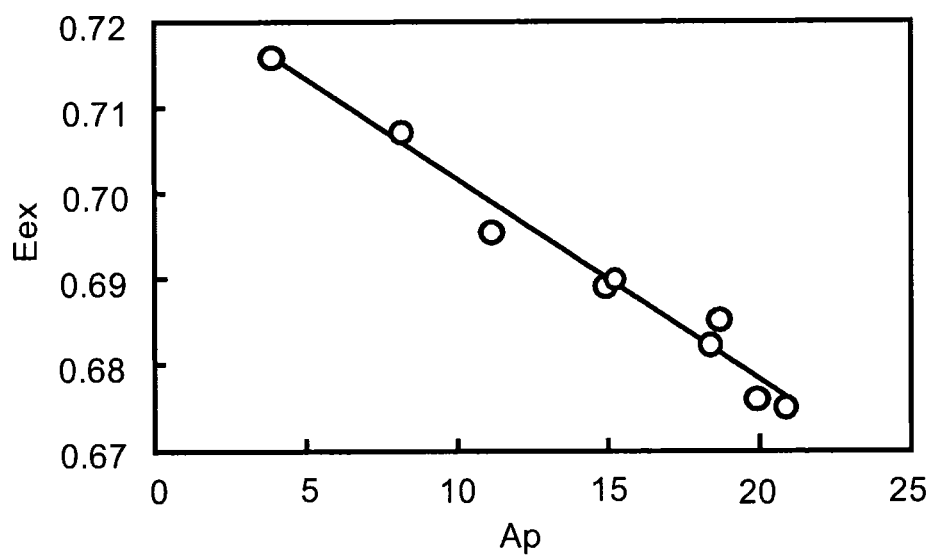

FIG. 6A and FIG. 6B are graphs illustrating characteristics of a semiconductor light emitting device.

In other words, FIG. 6A illustrates an experimental result about the relation between irregularity of the substrate 10 and crystal quality of the first semiconductor layer 20. The horizontal axis of FIG. 6A is a ratio AR of an area AF of a planar part to an area AS of an inclined side of an irregularity of the substrate 10. The inclined side of the irregularity of the substrate 10 is a face inclined with respect to the Z-axis direction. The planar part is a part perpendicular to the Z-axis direction. The vertical axis of FIG. 6A is an index CG indicating crystal quality in the first semiconductor layer 20. The index CG being zero indicates that at least either a void or a pit occurs in the crystal. The index CG being one indicates that substantially no occurrence of a void or a pit is observed in the crystal and that crystal quality is high.

As shown in FIG. 6A, crystal quality is high when the ratio AR of the area AF of the planar part to the area AS of the inclined side of the irregularity of the substrate 10 is high. In other words, the larger the area of the planar part, the higher the crystal quality is in the irregularity of the substrate 10. For example, let us assume that, with the face of the substrate 10 being the c-plane, the first semiconductor layer 20 is formed on the c-side. In the occasion, the planar part corresponds to the c-plane and the side which is the inclined face corresponds to a face other than the c-plane. When the planar part of the c-plane is relatively large, quality of the crystal to be grown thereon rises.

FIG. 6B illustrates the result of a simulation with regard to the relation between irregularity and light extraction efficiency of the substrate 10. In the simulation, it is assumed that a plurality of protrusions is provided on the substrate 10, where each of the protrusions has a planar part of the top portion and a planar part of the bottom portion, and an inclined side between the top portion and the bottom portion. In addition, the area of the planar part (top portion and bottom portion) converted into a value of per-protrusion basis is defined as an area Ap of the planar part. The area Ap of the planar part is a relative value. The horizontal axis of FIG. 6B indicates the area Ap of the planar part of the substrate 10. The vertical axis of FIG. 6B indicates the light extraction efficiency Eex (relative value).

As shown in FIG. 6B, when the area Ap of a planar part of the substrate 10 is small, the light extraction efficiency Eex is high. When the area Ap is large, the light extraction efficiency Eex is low. It is considered that extracting a part of the light emitted from the light emitting part 40 to the outside by total reflection is difficult in the planar part of the substrate 10.

As recited above, it is difficult to obtain both a high crystal quality and a high light extraction efficiency, in the reference example having only the first irregularity PD1 (e.g., the semiconductor light emitting devices 119a and 119b).

In the embodiment, both a high crystal quality and a high light extraction efficiency can be obtained by providing, in addition to the first irregularity PD1, the second irregularity PD2 having a small level difference on both the bottom face D1 and the top face P1 of the first irregularity PD1.

In other words, the bottom face D1 and the top face P1 of the first irregularity PD1 are faces which are substantially perpendicular to the Z-axis direction, with the bottom face D1 and the top face P1 providing a high crystal quality. In addition, the second irregularity PD2 provided on each of the bottom face D1 and the top face P1 allows efficient extraction of light which cannot be extracted when the bottom face D1 and the top face P1 are planar.

In the embodiment, degrading of crystal quality is suppressed by making the level difference of the second irregularity PD2 small.

Figure 7A:
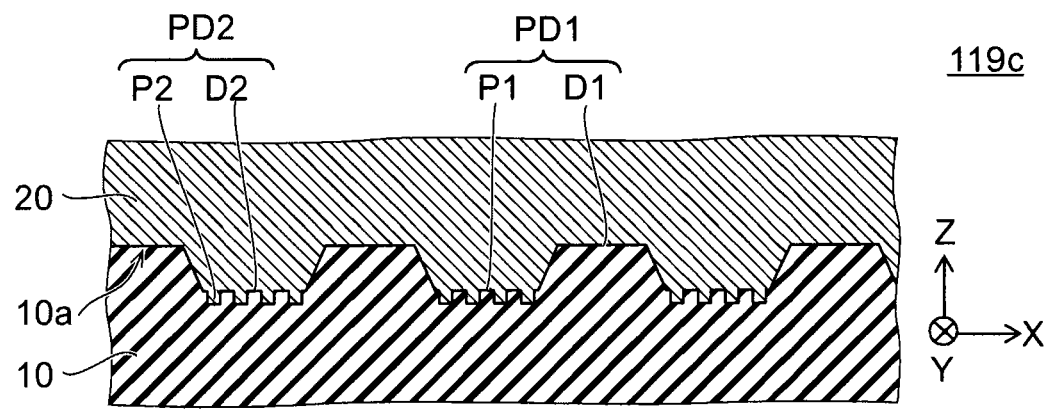
FIG. 7A and FIG. 7B are schematic cross-sectional views showing semiconductor light emitting devices of reference examples.
Figure 7B:
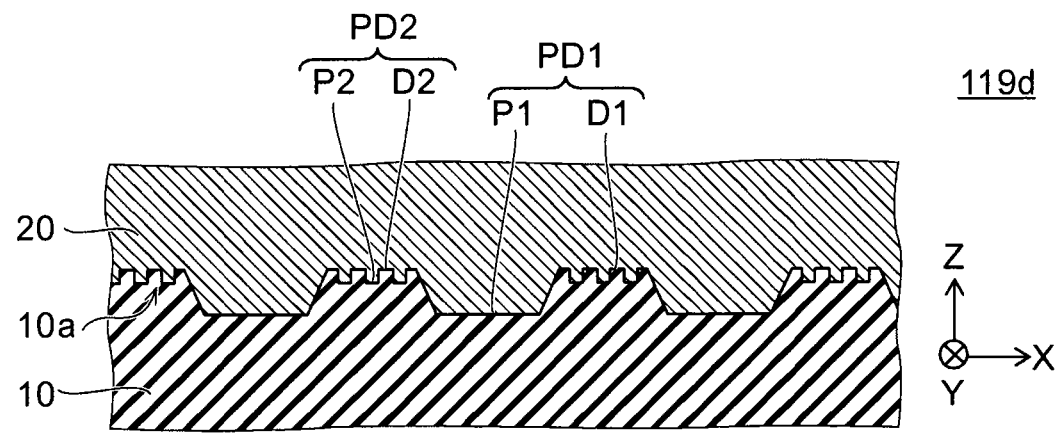

FIG. 7A and FIG. 7B are schematic cross-sectional views illustrating the configuration of semiconductor light emitting devices of reference examples.

As shown in FIG. 7A, although the second irregularity PD2 is provided on the top face P1 of the first irregularity PD1, the second irregularity PD2 is not provided on the bottom face D1, in the semiconductor light emitting device 119c of the third reference example. Accordingly, light extraction efficiency on the bottom face D1 is low.

As shown in FIG. 7B, although the second irregularity PD2 is provided on the bottom face D1 of the first irregularity PD1, the second irregularity PD2 is not provided on the top face P1 in the semiconductor light emitting device 119d of the fourth reference example. Accordingly, light extraction efficiency on the top face P1 is low.

On the contrary, since the second irregularity PD2 is provided on both the bottom face D1 and the top face P1 the first irregularity PD1 in the embodiment, a higher light extraction efficiency can be obtained than that of the semiconductor light emitting devices 119c and 119d of the third and fourth reference examples.

In the embodiment, it is desirable that the level difference between the top face P1 and the bottom face D1 (first height h1) is larger than the peak wavelength of the light emitted from the light emitting part 40, for example. At least one of a high crystal quality and a high light extraction efficiency may become difficult to be obtained, if the first height h1 is smaller than the peak wavelength.

The level difference between the top face P1 and the bottom face D1 (first height h1) is 1 micrometer (μm) or more and 5 μm or less, for example. Accordingly, a high crystal quality and a high light extraction efficiency can be easily obtained.

It is desirable that the level difference of the second irregularity PD2 (second height h2) does not exceed the peak wavelength of the light emitted from the light emitting part 40, for example. At least either a high light extraction efficiency or crystal quality may become difficult to be obtained, for example, if the second height h2 is larger than the peak wavelength.

It is desirable that the level difference of the second irregularity PD2 (second height h2) is 10 nm or more and 500 nm or less. If the second height h2 is smaller than 10 nm, the effect of changing the optical path decreases, making it difficult to enhance the light extraction efficiency. If the second height h2 is larger than 500 nm, the effect of changing the optical path may become small, making it difficult to obtain a high light extraction efficiency.

For example, the level difference of the second irregularity PD2 (second height h2) does not exceed 1/10 of the level difference between the top face P1 and the bottom face D1 (first height h1). Accordingly, a high crystal quality and a high light extraction efficiency can be easily obtained.

As shown in FIG. 1B, the bottom face D1 has its width in a direction perpendicular to the Z-axis direction (first bottom face width wd1). The top face P1 has its width in a direction perpendicular to the Z-axis direction (first top face width wp1). The first bottom face width wd1 corresponds to the width of the protrusion provided on the substrate 10. The first top face width wp1 corresponds to the width of the depression provided on the substrate 10. In addition, the distance between the bottom faces D1 is the distance wdd between the bottom faces. The sum of the first bottom face width wd1 and the distance wdd between the bottom faces corresponds to the arrangement pitch of the top face P1 (in other words, the arrangement pitch of the bottom face D1).

The bottom portion D2 of the second irregularity PD2 provided on the bottom face D1 has its width in a direction perpendicular to the Z-axis direction (bottom face second bottom width wd21). The top portion P2 of the second irregularity PD2 provided on the bottom face D1 has its width in a direction perpendicular to the Z-axis direction (bottom face second top width wp21). The bottom portion D2 of the second irregularity PD2 provided on the top face P1 has its width in a direction perpendicular to the Z-axis direction (top face second bottom width wd22). The top P2 of the second irregularity PD2 provided on the top face P1 has its width in a direction perpendicular to the Z-axis direction (top face second top width wp22).

The top face second bottom width wd22 may be equal to the bottom face second bottom width wd21. The top face second bottom width wd22 may be different from the bottom face second bottom width wd21. The top face second top width wp22 may be equal to the bottom face second top width wp21. The top face second top width wp22 may be different from the bottom face second top width wp21.

In the following, for simplicity, description will be provided assuming that the top face second bottom width wd22 and the bottom face second bottom width wd21 are the second bottom width wd2. Description will also be provided assuming that the top face second top width wp22 and the bottom face second top width wp21 are the second top width wp2.

In the embodiment, it is desired that the width in the Z-axis direction of the bottom face D1 (first bottom face width wd1) and the width in the Z-axis direction of the top face P1 (first top face width wp1) are larger than the peak wavelength of the light emitted from the light emitting part 40. At least either a high crystal quality or a high light extraction efficiency may be difficult to be obtained if the first bottom face width wd1 and the first top face width wp1 are smaller than the peak wavelength.

It is desirable that the width in the Z-axis direction of the bottom face D1 (first bottom face width wd1) and the width in the Z-axis direction of the top face P1 (first top face width wp1) are 1 μm or more and 5 μm or less. Accordingly, a high crystal quality and a high light extraction efficiency can be easily obtained.

It is desirable that the width of the bottom portion D2 of the second irregularity PD2 (second bottom width wd2) and the width of the top portion P2 of the second irregularity PD2 (second top width wp2) do not exceed the peak wavelength of the light emitted from the light emitting part 40. If the second bottom width wd2 and the second top width wp2 are larger than the peak wavelength, at least either a high light extraction efficiency or a high crystal quality may become difficult to be obtained.

It is desirable that the width of the top portion P2 of the second irregularity PD2 (second top width wp2) is 10 nm or more and 500 nm or less. If the second bottom width wd2 and the second top width wp2 are smaller than 10 nm, the effect of changing the optical path may become small, making it difficult to enhance the light extraction efficiency. If the second bottom width wd2 and the second top width wp2 are larger than 500 nm, the effect of changing the optical path may become small, making it difficult to obtain a high light extraction efficiency.

For example, the width of the bottom portion D2 of the second irregularity PD2 (second bottom width wd2) and the width of the top portion P2 of the second irregularity PD2 (second top width wp2) do not exceed 1/10 of the width of the bottom face D1 of the first irregularity PD1 (first bottom face width wd1) and the width of the top face P1 (first top face width wp1). Accordingly, a high crystal quality and a high light extraction efficiency can be easily obtained.

As shown in FIG. 1, in the embodiment, the first irregurality PD1 further has a wall face WF (side face of the first irregurality PD1) provided between the bottom face D1 and the top face P1. The wall face WF of the first irregularity PD1 may be inclined with respect to the Z-axis direction. The light extraction efficiency can be further enhanced by causing the wall face WF of the first irregularity PD1 to be inclined with respect to the Z-axis direction.

An angle $\theta_p$ between the wall face WF of the first irregularity PD1 and the Z-axis direction can be controlled, for example, by controlling the angle of the side face of the irregularity provided on the substrate 10 against the Z-axis direction. For example, when the surface of the substrate 10 is processed by dry etching to form the irregularity, the angle of the side face of the irregularity of the substrate 10 can be controlled by controlling the etching condition. When the surface of the substrate 10 is processed by wet etching to form the irregularity, the angle of the side face of the irregularity of the substrate 10 is controlled by the crystal orientation of the substrate 10.

The angle $\theta_p$ between the wall face WF of the first irregularity PD1 and the Z-axis direction is, for example, 10 degrees or more and 40 degrees or less. More specifically, the angle $\theta_p$ is about 30 degrees, for example.

Figure 8A:
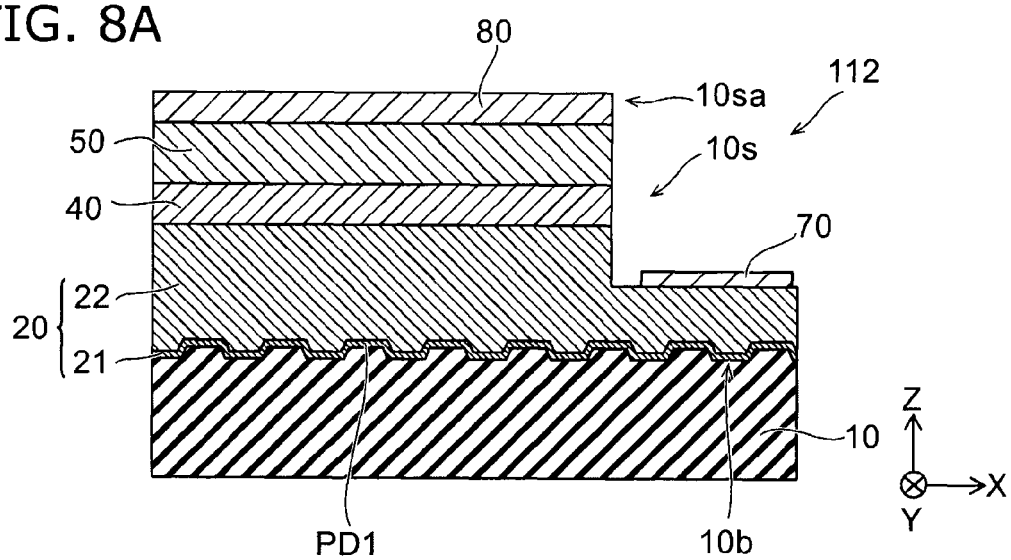
FIG. 8A and FIG. 8B are cross-sectional views showing another semiconductor light emitting device according to the first embodiment.
Figure 8B:
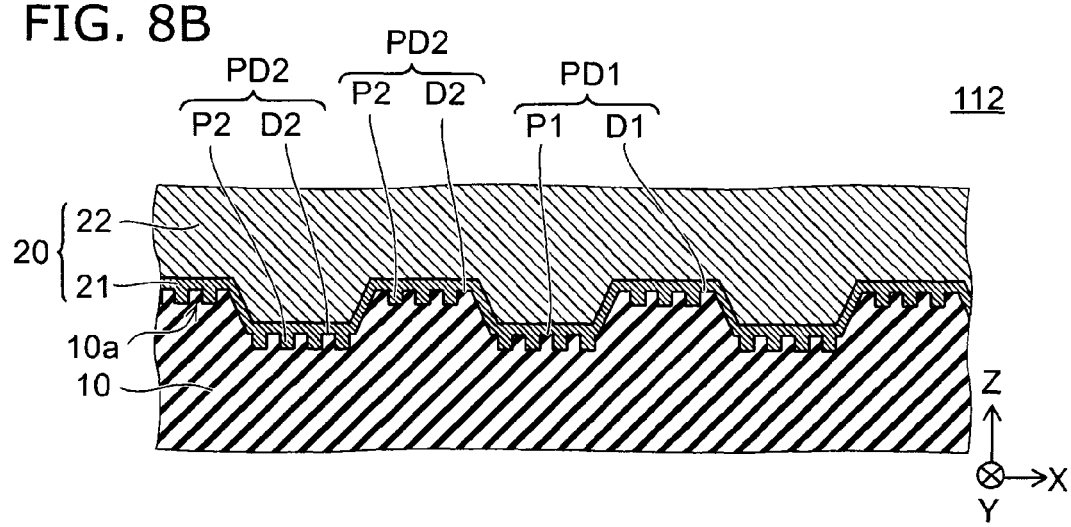

FIG. 8A and FIG. 8B are cross-sectional views illustrating the configuration of another semiconductor light emitting device according to the first embodiment.

As shown in FIG. 8A and FIG. 8B, in another semiconductor light emitting device 112 according to the embodiments, the first semiconductor layer 20 includes the buffer layer 21 and an n-type contact layer 22. The n-type contact layer 22 is provided between the buffer layer 21 and the light emitting part 40. A GaN layer, for example, is used for the buffer layer 21. An n-type GaN layer, for example, is used for the n-type contact layer 22. The n-type contact layer 22 is at least a part of the n-type semiconductor layer.

The buffer layer 21 is formed on the substrate 10 having an irregularity. The buffer layer 21 has the n-type contact layer 22 formed thereon.

Also in the case, the second irregularity PD2 is provided on the bottom face D1 and the top face P1 of the first irregularity PD1. Accordingly, a semiconductor light emitting device having a high crystal quality and a high light extraction efficiency can be obtained.

Figure 9:
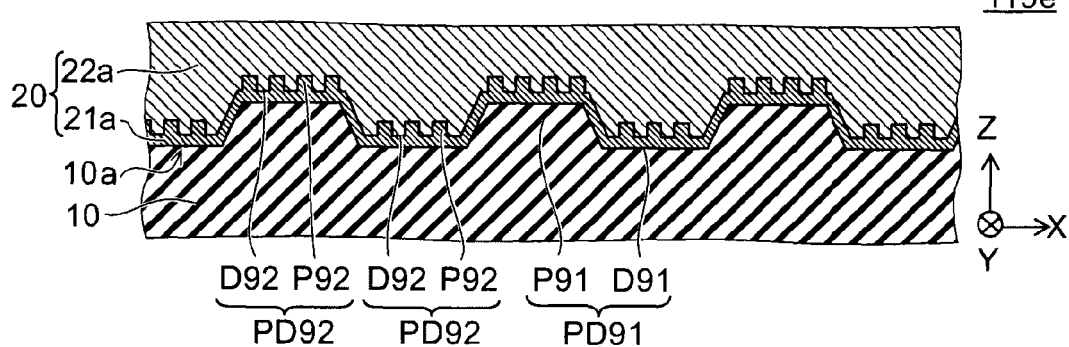
FIG. 9 is a schematic cross-sectional view showing a semiconductor light emitting device of a reference example.

FIG. 9 is a schematic cross-sectional view illustrating the configuration of the semiconductor light emitting device of a reference example.

As shown in FIG. 9, in the semiconductor light emitting device 119e of the fifth reference example, a substrate irregularity PD91 with a size corresponding to the first irregularity PD1 is provided on the substrate 10. The substrate irregularity PD91 has a substrate bottom face D91 and a substrate top face P91.

The buffer layer 21a is formed on the substrate 10 described above. The buffer layer 21a has a buffer layer irregularity PD92. The buffer layer irregularity PD92 is provided on the substrate bottom face D91 and the substrate top face P91. The level difference of the buffer layer irregularity PD92 is smaller than the level difference between the substrate bottom face D91 and the substrate top face P91 of the substrate irregularity PD91.

The n-type contact layer 22a is formed on the buffer layer 21a described above. The interface between the buffer layer 21a and the n-type contact layer 22 has an irregularity reflecting the shapes of both the substrate irregularity PD91 and the buffer layer irregularity PD92.

If the difference between the refractive index of the buffer layer 21a and the refractive index of the n-type contact layer 22a is large, the direction of travel of the light may be changed at the interface between the buffer layer 21a and the n-type contact layer 22, and the light extraction efficiency may become high. However, in a practical semiconductor light emitting device, the difference between the refractive index of the buffer layer 21a and the refractive index of the n-type contact layer 22a is small.

For example, GaN is used in the buffer layer 21a and the n-type contact layer 22a, whose refractive indices being substantially the same. Therefore, under a practical condition, the characteristic with regard to light extraction in the semiconductor light emitting device 119e of the fifth reference example shows a similar characteristic as where only the large-sized substrate irregularity PD91 is provided.

On the contrary, in the embodiment, the first irregularity PD1 and the second irregularity PD2 are provided on the first major surface 10a of the first semiconductor layer 20 including the buffer layer 21, also in the case where the buffer layer 21 is provided. In other words, the first irregularity PD1 and the second irregularity PD2 are provided on the interface between the substrate 10 and the first semiconductor layer 20 (e.g., the buffer layer 21). Accordingly, a high light extraction efficiency due to contribution of both the first irregularity PD1 and the second irregularity PD2 can be obtained.

For example, the refractive index of sapphire used for the substrate 10 is 1.76 to 1.77. The refractive index of GaN used for the buffer layer 21a and the n-type contact layer 22a is about 2.5. Therefore, the difference between the refractive index of the first semiconductor layer 20 and the refractive index of the substrate 10 is large at the first major surface 10a on which the first irregularity PD1 and the second irregularity PD2 are provided. Accordingly, a high light extraction efficiency can be obtained.

As recited above, the refractive index of the substrate 10 is different from the refractive index of the first semiconductor layer 20 in the embodiment, when the substrate 10 is provided. For example, the refractive index of the substrate 10 is smaller than the refractive index of the first semiconductor layer 20. Accordingly, the direction of travel of the light is changed at the interface between the substrate 10 and the first semiconductor layer 20, whereby light can be efficiently extracted.

Figure 10A:
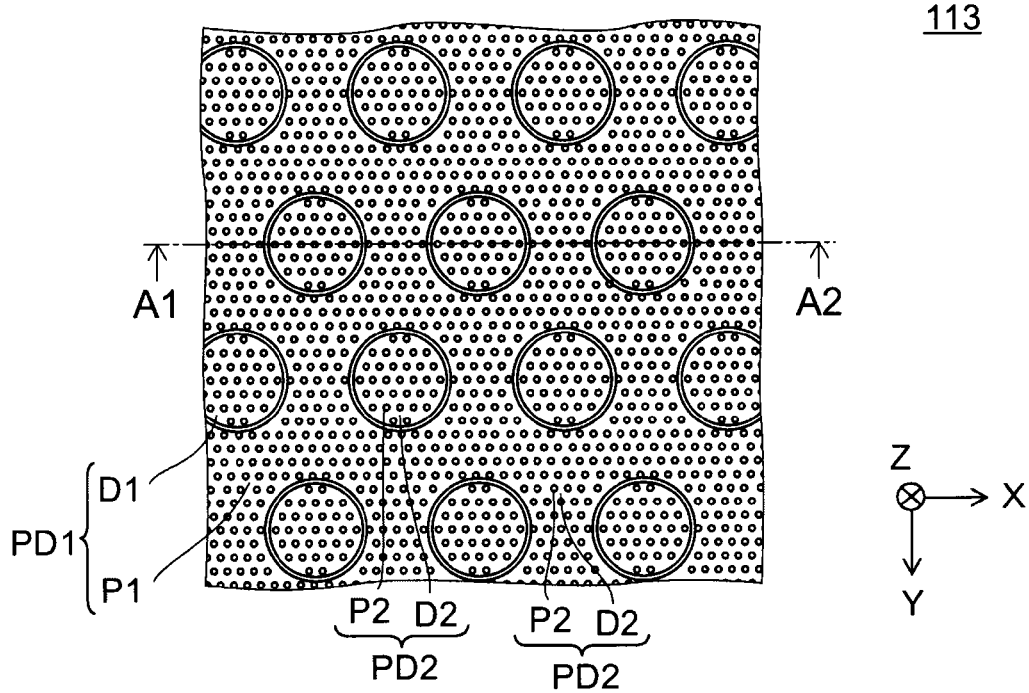
FIG. 10A and FIG. 10B are schematic views showing another semiconductor light emitting device according to the first embodiment.
Figure 10B:
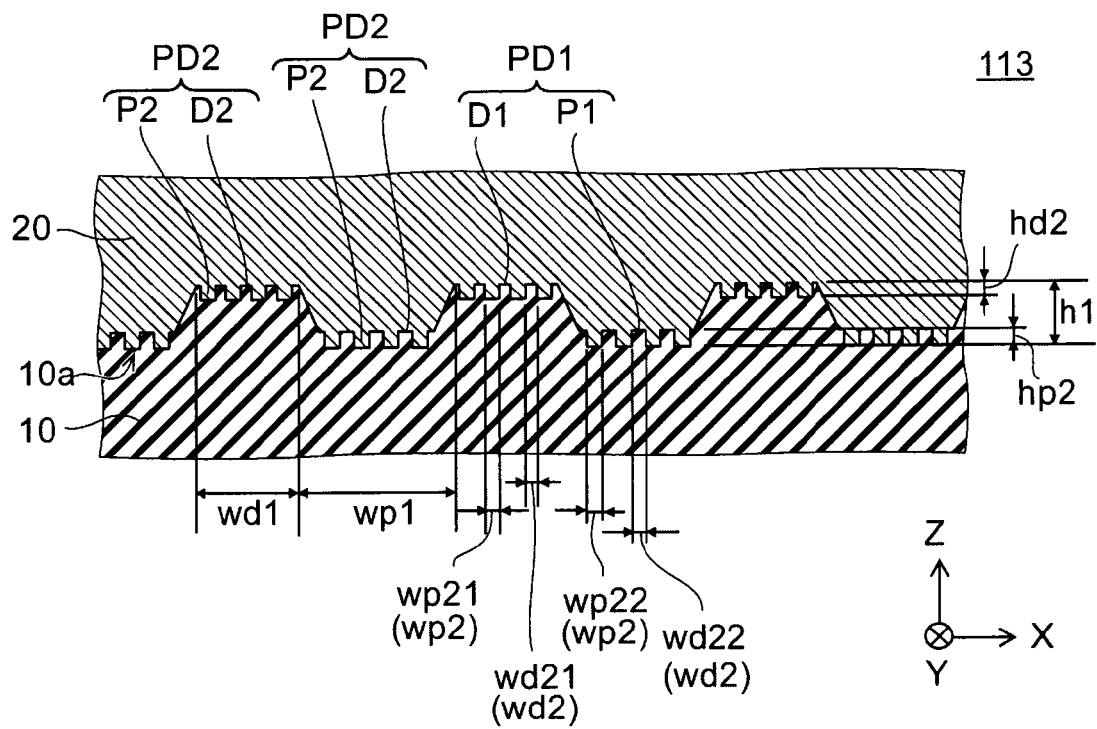

FIG. 10A and FIG. 10B are schematic views illustrating the configuration of another semiconductor light emitting device according to the first embodiment.

FIG. 10A is a plan view. FIG. 10B is a cross-sectional view taken along the line A1-A2 of FIG. 10A.

As shown in FIG. 10A and FIG. 10B, the first irregularity PD1 is also provided in another semiconductor light emitting device 113 according to the embodiments. The second irregularity PD2 is provided on the bottom face D1 and the top face P1 of the first irregularity PD1. In the example, the top face P1 is continuous on the first major surface 10a. In other words, a plurality of depressions is provided in a region of continuous protrusions in the first major surface 10a.

A high crystal quality and a high light extraction can also be efficiently obtained in the semiconductor light emitting device 113 described above.

Although the planar shape of the bottom portion D2 or the top portion P2 of the first irregularity PD1 is circular in the above-mentioned semiconductor light emitting device, the planar shape is arbitrary in the embodiment.

Figure 11A:
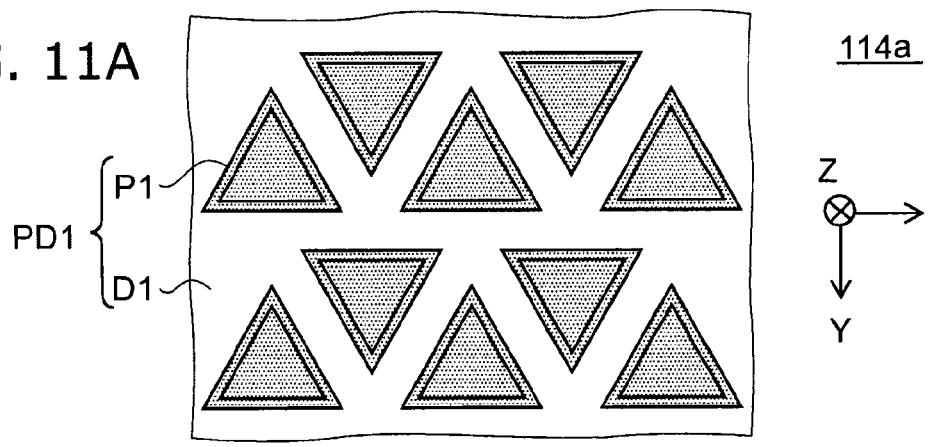
FIG. 11A to FIG. 11C are plan views showing other semiconductor light emitting devices according to the first embodiment.
Figure 11B:
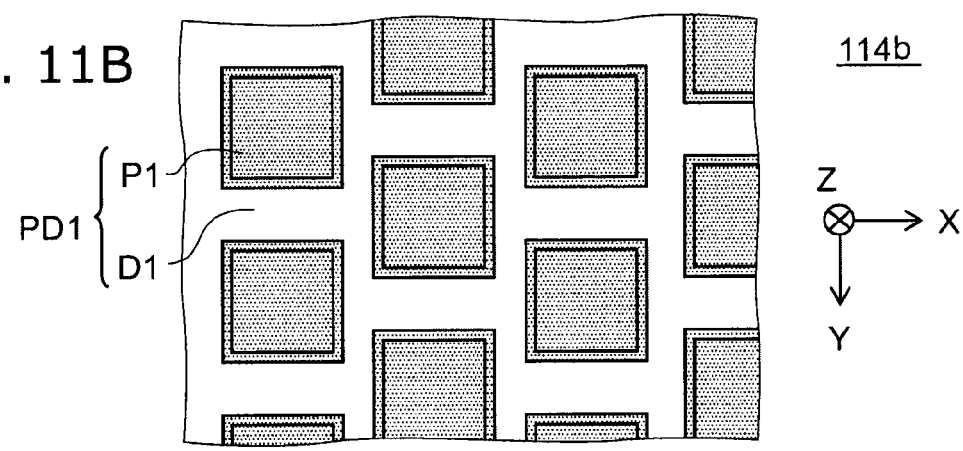
Figure 11C:
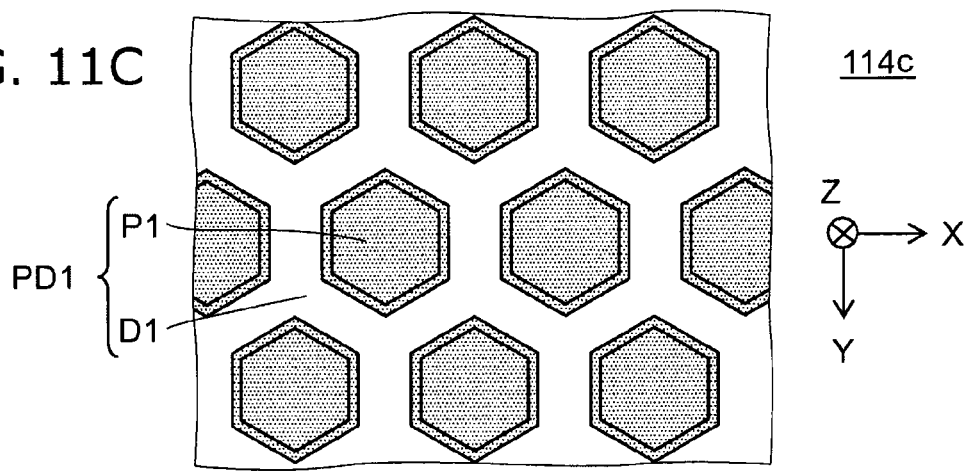

FIG. 11A to FIG. 11C are plan views illustrating the configuration of other semiconductor light emitting devices according to the first embodiment.

Figure 12A:
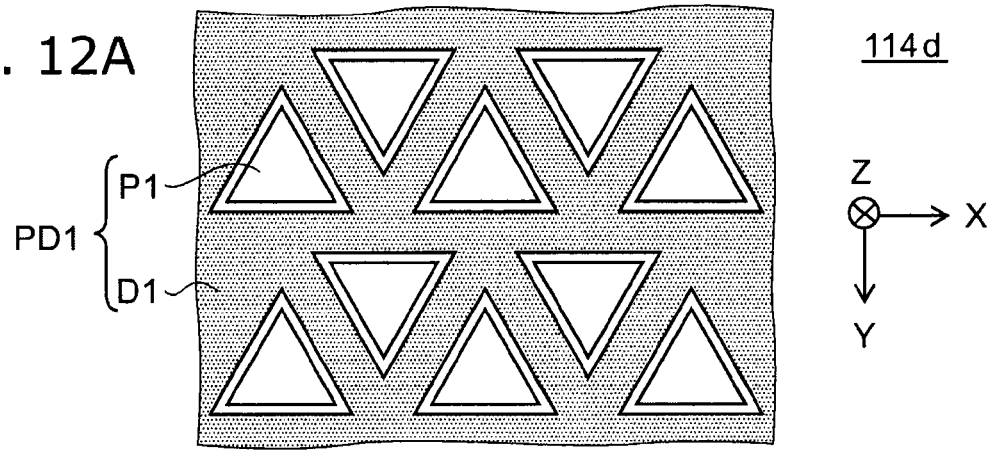
FIG. 12A to FIG. 12C are plan views showing other semiconductor light emitting devices according to the first embodiment.
Figure 12B:
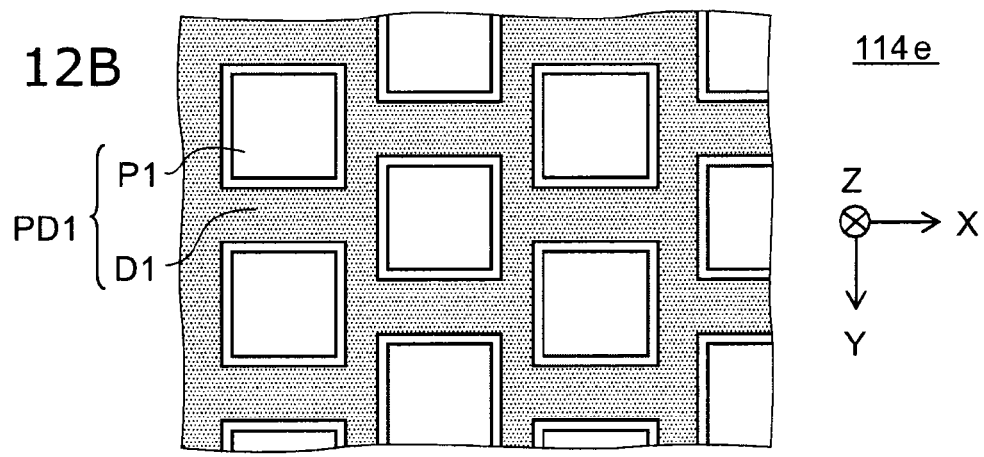
Figure 12C:
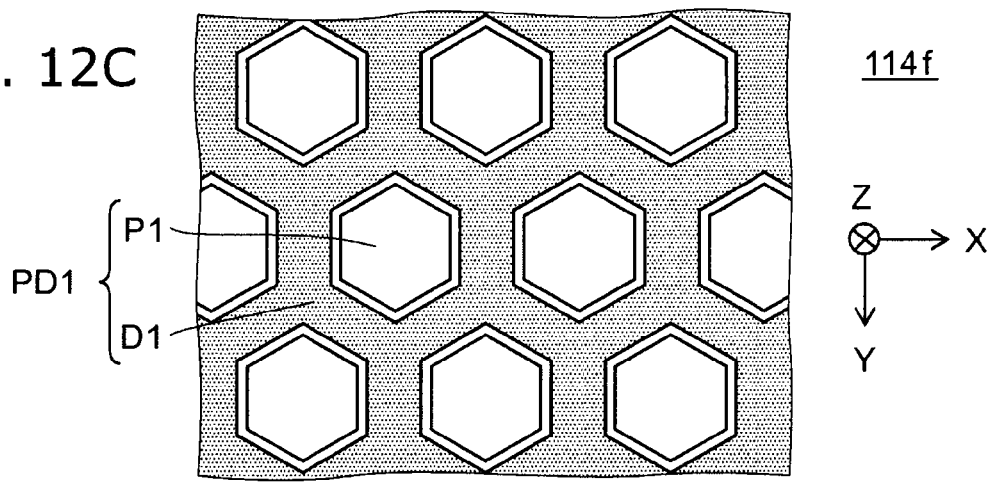

FIG. 12A to FIG. 12C are plan views illustrating the configuration of other semiconductor light emitting devices according to the first embodiment.

Figure 13A:
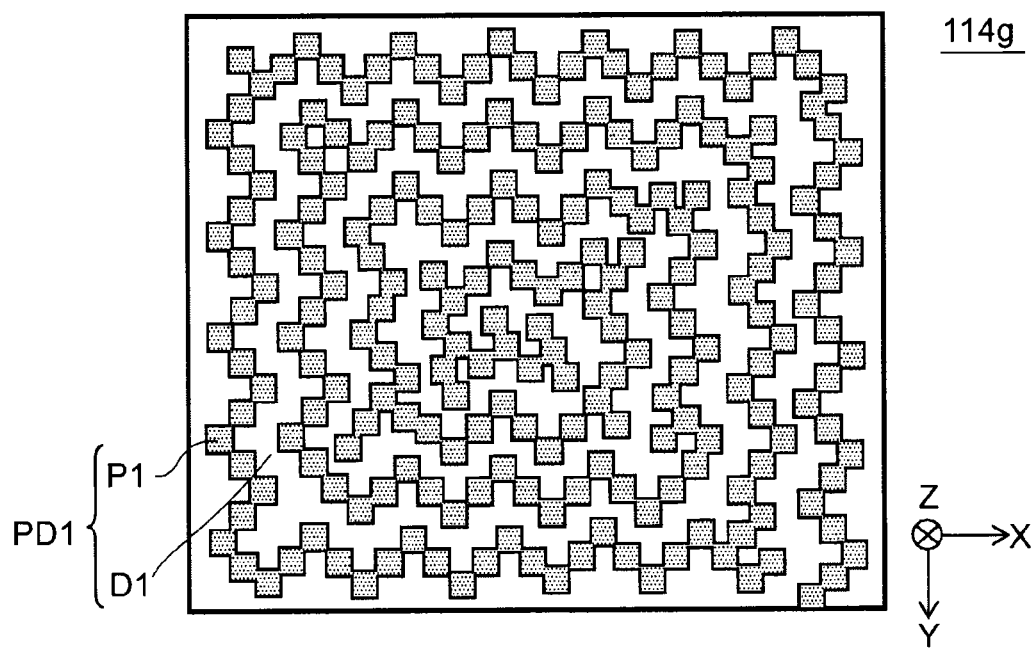
FIG. 13A and FIG. 13B are plan views showing other semiconductor light emitting devices according to the first embodiment.
Figure 13B:
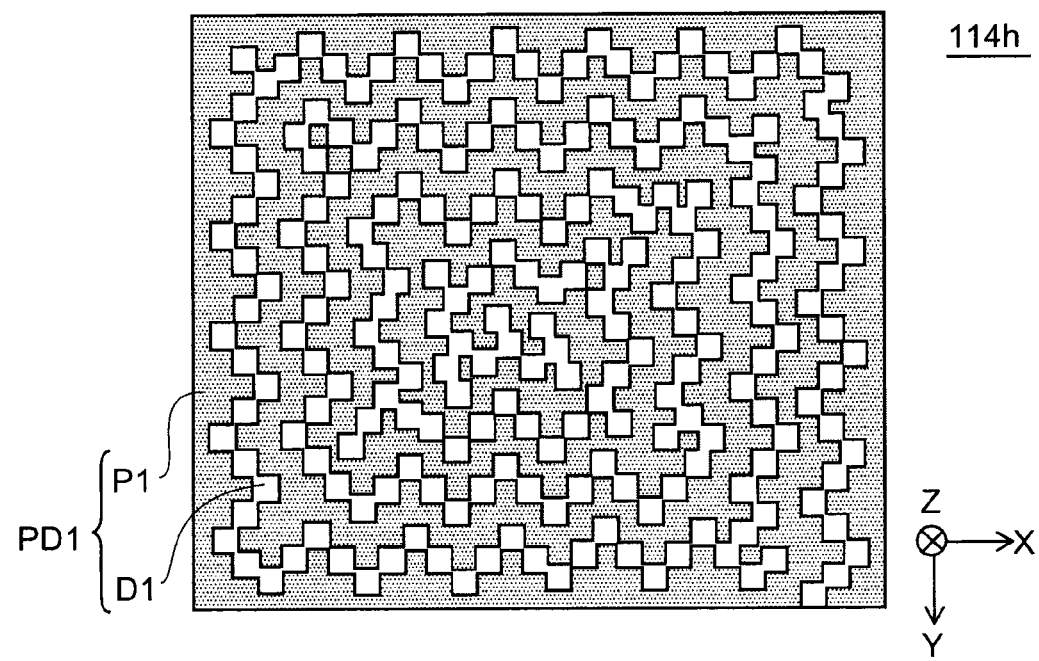

FIG. 13A and FIG. 13B are plan views illustrating the configuration of other semiconductor light emitting devices according to the first embodiment.

In other words, the drawings are plan views of the first major surface 10a of the first semiconductor layer 20, when seen in the Z-axis direction. When the substrate 10 is provided in the semiconductor light emitting device, the drawings correspond to a plan view of the first major surface 10a seen through the substrate 10. Although the second irregularity PD2 is omitted in the drawings so that the drawing can be seen more easily, the above-mentioned second irregularity PD2 is provided on the bottom face D1 and the top face P1 of the first irregularity PD1.

As shown in FIG. 11A, the continuous bottom face D1 and the top faces P1 are provided in a semiconductor light emitting device 114a. The planar shape of the top faces P1 is triangular.

As shown in FIG. 11B, the continuous bottom face D1 and the top faces P1 are provided in a semiconductor light emitting device 114b. The planar shape of the top faces P1 is quadrangular.

As shown in FIG. 11C, the continuous bottom face D1 and the top faces P1 are provided in a semiconductor light emitting device 114c. The planar shape of the top faces P1 is hexagonal.

As shown in FIG. 12A, the continuous the top face P1 and the bottom faces D1 are provided in a semiconductor light emitting device 114d. The planar shape of the bottom face D1 is triangular.

As shown in FIG. 12B, the continuous top face P1 and the bottom faces D1 are provided in a semiconductor light emitting device 114e. The planar shape of the bottom face D1 is quadrangular.

As shown in FIG. 12C, the continuous top face P1 and the bottom faces D1 are provided in a semiconductor light emitting device 114f. The planar shape of the bottom face D1 is hexagonal.

As recited above, the planar shape of the bottom face D1 and the top face P1 is arbitrary. Arrangement of the bottom face D1 and the top face P1 is also arbitrary.

As shown in FIG. 13A and FIG. 13B, the bottom face D1 is continuous in a semiconductor light emitting device 114g and a semiconductor light emitting device 114h, with the top face P1 also being continuous. The planar shape of the bottom face D1 and the planar shape of the top face P1 are spiral. As recited above, the first irregularity PD1 can have a single bottom face D1 and a single top face P1.

In the following, an exemplary method for manufacturing a semiconductor light emitting device (e.g., the semiconductor light emitting devices 110 to 113, 114a to 114h) according to the embodiments will be described.

The following manufacturing method is a method for manufacturing a semiconductor light emitting device comprising the first semiconductor layer 20 including an n-type semiconductor layer, the second semiconductor layer 50 including a p-type semiconductor layer, and the light emitting part 40 provided between the first semiconductor layer 20 and the second semiconductor layer 50, and including the barrier layers BL and the well layer WL provided between the barrier layers BL. In the semiconductor light emitting device, the first semiconductor layer 20 has the first irregularity PD1 provided on the first major surface 10a of the first semiconductor layer 20 on an opposite side to the light emitting part 40, and the second irregularity PD2 provided on the bottom face D1 and the top face P1 of the first irregularity PD1 with a level difference (second height h2) smaller than the level difference between the bottom face D1 and the top face P1 (first height h1).

Figure 14:
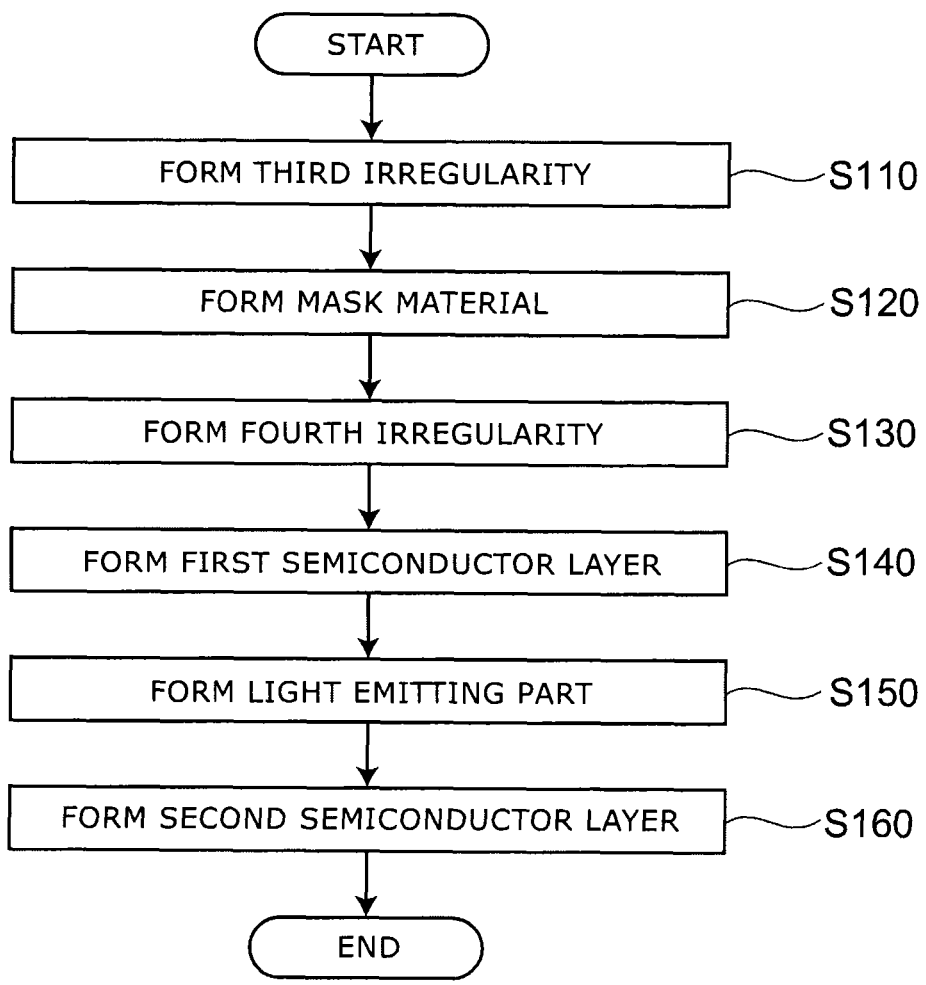
FIG. 14 is a flow chart showing a method for manufacturing the semiconductor light emitting device according to the first embodiment.

FIG. 14 is a flow chart illustrating the method for manufacturing the semiconductor light emitting device according to the first embodiment.

FIG. 15A to FIG. 15E are schematic cross-sectional views in the order of processing, illustrating the method for manufacturing the semiconductor light emitting device according to the first embodiment.

As shown in FIG. 14, a third irregularity to be the basis of the second irregularity PD2 is formed on the substrate major surface of the substrate 10, in the manufacturing method (step S110).

For example, an imprint method is used to form the third irregularity.

Figure 15A:
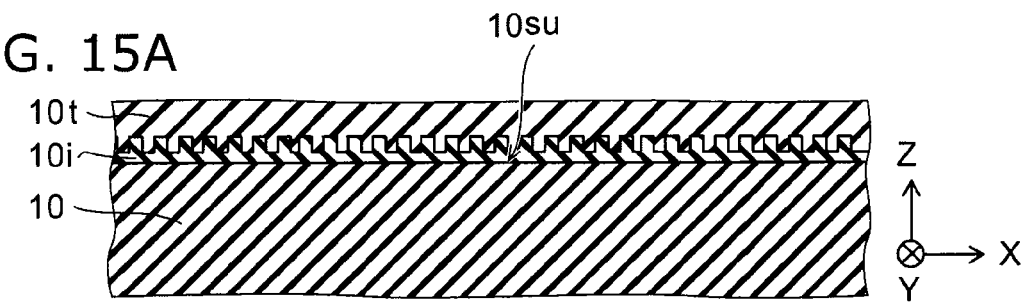
FIG. 15A to FIG. 15E are schematic cross-sectional views in order of the processes, showing the method for manufacturing the semiconductor light emitting device according to the first embodiment.

As shown in FIG. 15A, for example, an imprint material 10i (e.g., resist) is applied on a substrate major surface 10su of the substrate 10. In the occasion, a mask material layer may be separately provided to the substrate major surface 10su. A template 10t is then caused to contact with the imprint material 10i. An irregularity to be the basis of the third irregularity has been provided on the transfer surface of the template 10t. The imprint material 10i deforms in the irregularity of the transfer surface of the template 10t. Under such condition, light, for example, is irradiated on the imprint material 10i to cure the imprint material 10i.

The imprint material 10i is then used as a mask to process the substrate 10. Alternatively, a mask material layer provided on the substrate major surface 10su is processed, with the imprint material 10i being the mask. Subsequently, the substrate 10 is processed using the mask material layer as the mask. RIE (Reactive Ion Etching), for example, is used for the processing.

Figure 15B:
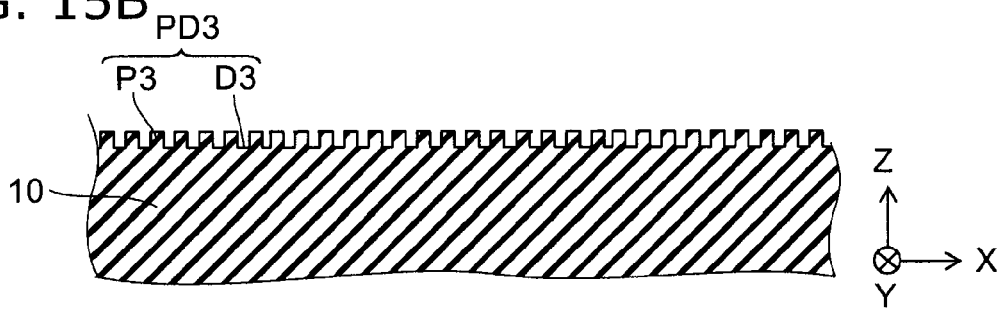

As a result, as shown in FIG. 15B, a third irregularity PD3 to be the basis and of the second irregularity PD2 is formed on the substrate major surface 10su of the substrate 10. The third irregularity PD3 has a third bottom portion D3 and a third top portion P3. For example, the third bottom portion D3 has a height and a width corresponding to the second top portion P2. For example, the third top portion P3 has a height and a width corresponding to the second bottom portion D2.

In the foregoing, although imprinting is used to form the third irregularity PD3, the method for forming the third irregularity PD3 is arbitrary.

Figure 15C:
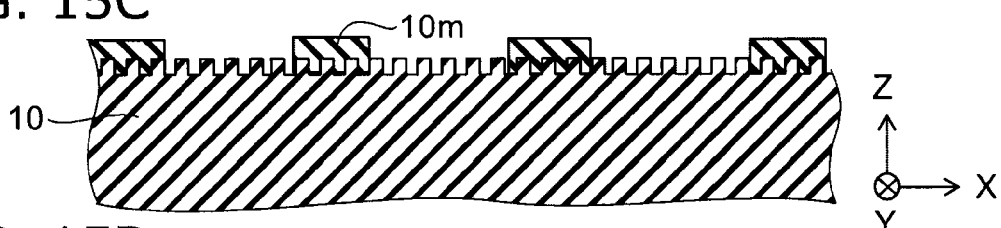

As shown in FIG. 15C and FIG. 14, a mask material 10m having a pattern shape corresponding to the pattern of the first irregularity PD1 is formed on the substrate major surface 10su having the third irregularity PD3 formed thereon (step S120).

Figure 15D:
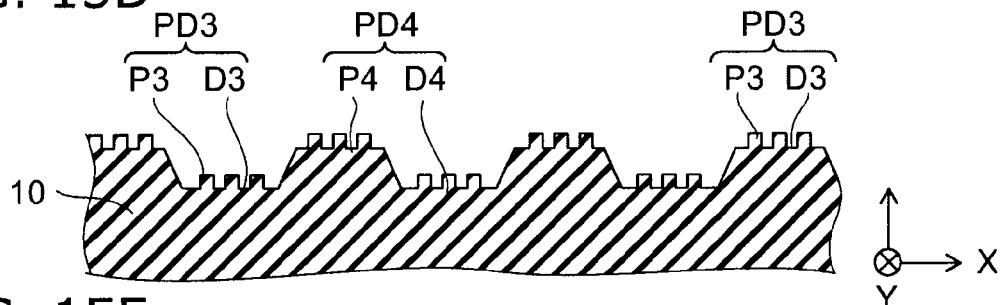

As shown in FIG. 15D and FIG. 14, the substrate major surface 10su is processed using the mask material 10m as the mask to form a fourth irregularity PD4 to be the basis of the first irregularity PD1 (step S130).

The fourth irregularity PD4 has a fourth bottom portion D4 and a fourth top portion P4. For example, the fourth bottom portion D4 has a height and a width corresponding to the first top face P1. For example, the fourth top portion P4 has a height and a width corresponding to the first bottom face D1. As recited above, the substrate 10, the substrate major surface 10su has the fourth irregularity PD4 and the third irregularity PD3 formed thereon.

Figure 15E:
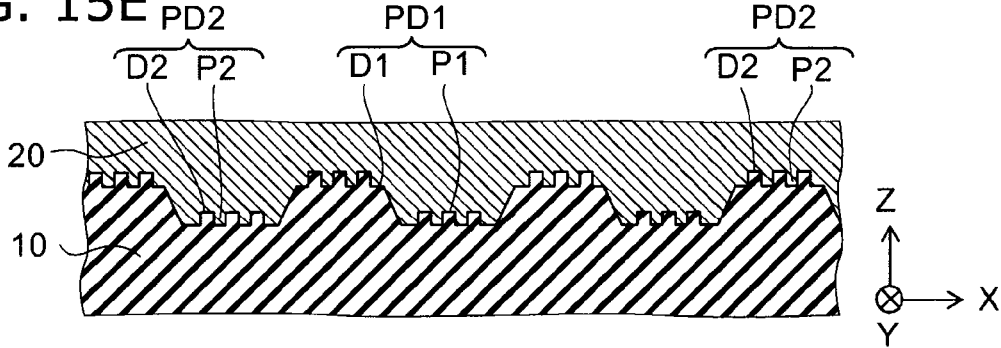

As shown in FIG. 15E and FIG. 14, the first semiconductor layer 20 is then formed on the substrate major surface 10su (step S140).

As a result, the first irregularity PD1 reflecting the shape of the fourth irregularity PD4 and the second irregularity PD2 reflecting the shape of the third irregularity PD3 are formed on the first semiconductor layer 20.

Subsequently, as shown in FIG. 14, the light emitting part 40 is formed on the first semiconductor layer 20 (step S150). The second semiconductor layer 50 is formed on the light emitting part 40 (step S160). The n-side electrode 70 and the p-side electrode 80 are then formed, whereby the semiconductor light emitting device according to the embodiments is manufactured. The substrate 10 may be removed in any technically feasible process.

In the manufacturing method according to the embodiments, a semiconductor light emitting device having a high crystal quality and a high light extraction efficiency can be manufactured with a good productivity.

Second Embodiment

A semiconductor light emitting device 120 according to the embodiments also includes the first semiconductor layer 20 including an n-type semiconductor layer, the second semiconductor layer 50 including a p-type semiconductor layer, and the light emitting part 40 provided between the first semiconductor layer 20 and the second semiconductor layer 50, and including the barrier layers BL and the well layer WL provided between the barrier layers BL. Since the configuration of the first semiconductor layer 20, the second semiconductor layer 50, and the light emitting part 40 is similar to that of the semiconductor light emitting device 110 (or the semiconductor light emitting device 111), description thereof is omitted in the following. The configuration for the first major surface 10a of the first semiconductor layer 20 of the semiconductor light emitting device 120 is different from the configuration of the first embodiment. In the following, the configuration for the first major surface 10a of the first semiconductor layer 20 of the semiconductor light emitting device 120 will be described.

Figure 16A:
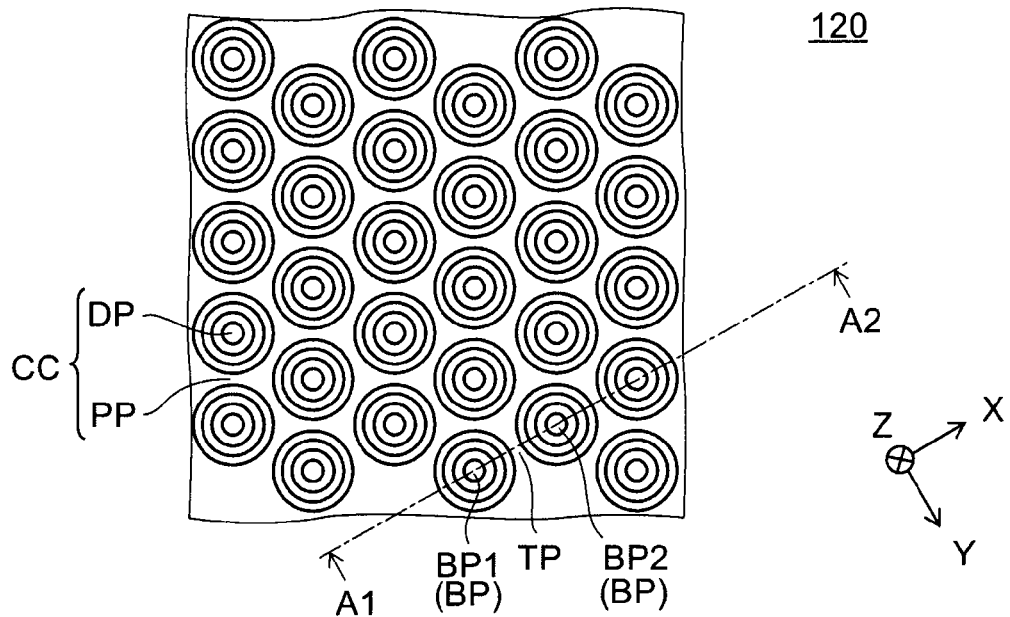
FIG. 16A and FIG. 16B are schematic views showing a semiconductor light emitting device according to a second embodiment.
Figure 16B:
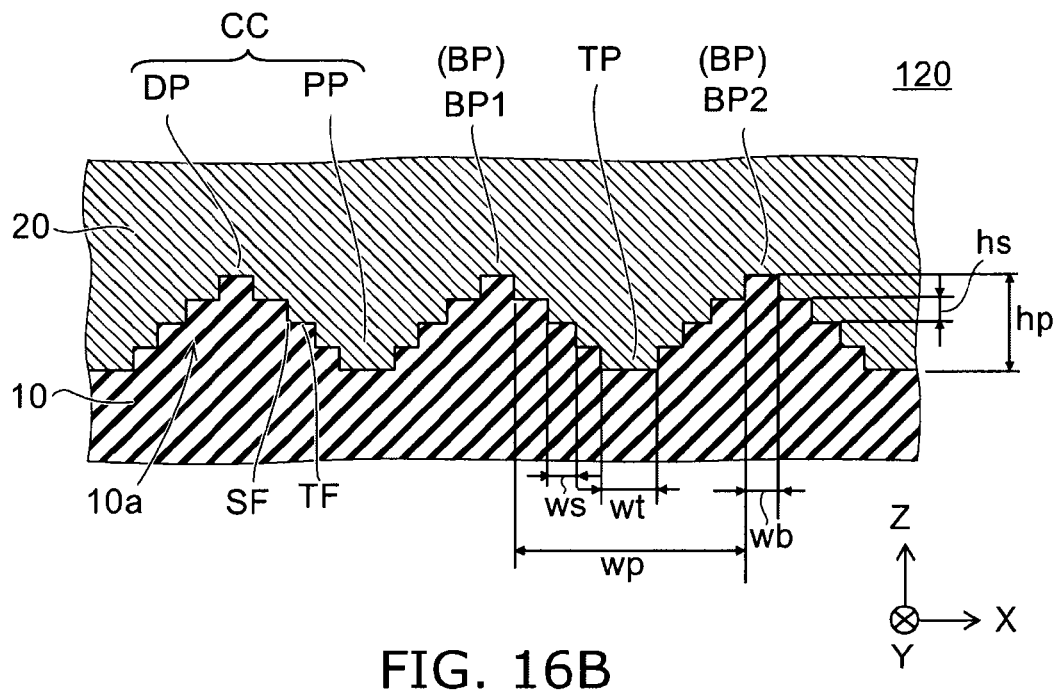

FIG. 16A and FIG. 16B are schematic views illustrating the configuration of a semiconductor light emitting device according to a second embodiment.

FIG. 16A is a plan view of the first major surface 10a of the first semiconductor layer 20 of the semiconductor light emitting device 120 according to the embodiments, when seen in the Z-axis direction. If the substrate 10 is provided in the semiconductor light emitting device 120, FIG. 16A corresponds to a plan view seeing the first major surface 10a through the substrate 10. FIG. 16B is a cross-sectional view taken along the line A1-A2 of FIG. 16A.

As shown in FIG. 16A and FIG. 16B, the first semiconductor layer 20 has an irregularity CC provided on the first major surface 10a of the first semiconductor layer 20 on the opposite side to the light emitting part 40.

The irregularity CC has a step-like side face SF. The side face SF includes a plurality of terrace faces TF which are perpendicular to the Z-axis direction (first direction) toward the second semiconductor layer 50 from the first semiconductor layer 20. The overall direction of the side face SF (direction averaging the side face SF) is inclined with respect to the Z-axis direction. The height of the side face SF varies in a step-like manner. Although the number of processes is 4 in the specific example, the number of processes provided in the side face SF is arbitrary in the embodiment.

The irregularity CC has a protrusion PP and a depression DP. In the example, the protrusion PP is continuous on the first major surface 10a. In other words, a plurality of depressions DP is provided in a region of the continuous protrusion PP on the first major surface 10a. In the specific example, the planar shape of the depressions DP is circular. The centers of the depressions DP are provided at respective positions of the centers and vertices of regular hexagons.

The irregularity CC has a plurality of bottom portions BP when the first major surface 10a is cut in a plane which is parallel with the Z-axis direction. For example, the bottom portions BP are first bottom portions BP1, second bottom portions BP2, or the like. The bottom portions BP are the lowest part among the depressions DP. In other words, the bottom portions BP are located at the longest distance from the protrusion PP among the depressions DP.

A top portion TP is provided between the depressions DP.

As shown in FIG. 16B, the height of the protrusion PP (i.e., depth of the depression DP) is an irregularity height hp. The height of each step of the side face SF is a step height hs.

In the embodiment, the width of the bottom portions BP in the second direction connecting the two bottom portions BP nearest to each other among the bottom portions BP, and the width in a second direction of the top portion TP of the irregularity CC do not exceed four times the width in the second direction of the terrace faces TF.

As shown in FIG. 16A, the second direction connecting the two bottom portions BP nearest to each other among the bottom portions BP is defined as the X-axis direction, for example. In other words, the second bottom portions BP2 are aligned with the first bottom portions BP1 in the X-axis direction in the example.

As shown in FIG. 16B, the width in the X-axis direction of the bottom portions BP is a bottom width wb. The width in the X-axis direction of the top portion TP is a top width wt. The width in the X-axis direction of the terrace face TF is a step width ws. The bottom width wb does not exceed four times the step width ws. The top width wt does not exceed four times the step width ws. As recited above, both the bottom width wb and the top width wt do not exceed a certain reference value (four times the step width ws) in the embodiment.

The width in the X-axis direction of a single depression DP is a depression width wd.

In the embodiment, the irregularity CC of the first semiconductor layer 20 described above can be obtained by forming, for example, the first semiconductor layer 20 on the substrate 10 having an irregular shape corresponding to the irregularity CC.

In other words, the first semiconductor layer 20 is formed on the substrate 10 by crystal growth, for example. The substrate 10 has an irregularity corresponding to the irregularity CC. The irregularity has a step-like side face. The side face includes a plurality of terrace faces which are perpendicular to the Z-axis direction (direction perpendicular to the major surface of the substrate 10). The substrate 10 has a top portion corresponding to the bottom portion BP of the first semiconductor layer 20 and a bottom portion corresponding to the top portion TP of the first semiconductor layer 20. The width of the top portion of the substrate 10 and the width of the bottom portion of the substrate 10 do not exceed four times the width of the terrace face of the substrate 10.

A semiconductor light emitting device having a high crystal quality and a high light extraction efficiency can be obtained by forming the first semiconductor layer 20 on the substrate 10 described above.

In other words, the substrate 10 having a step-like side face is used in the semiconductor light emitting device 120. The terrace face has a side which is substantially perpendicular to the Z-axis direction. The terrace face is, for example, the c-plane. As recited above, since a terrace face of the c-plane is provided on the surface of the substrate 10, the crystal to be grown thereon has a high quality.

In the substrate 10, the width of the surface perpendicular to the Z-axis direction is set equal to or smaller than a certain value (not exceeding four times the width of the terrace face). Accordingly, a high light extraction efficiency can be obtained.

As recited above, a semiconductor light emitting device having a high crystal quality a high light extraction can be obtained.

Figure 17A:
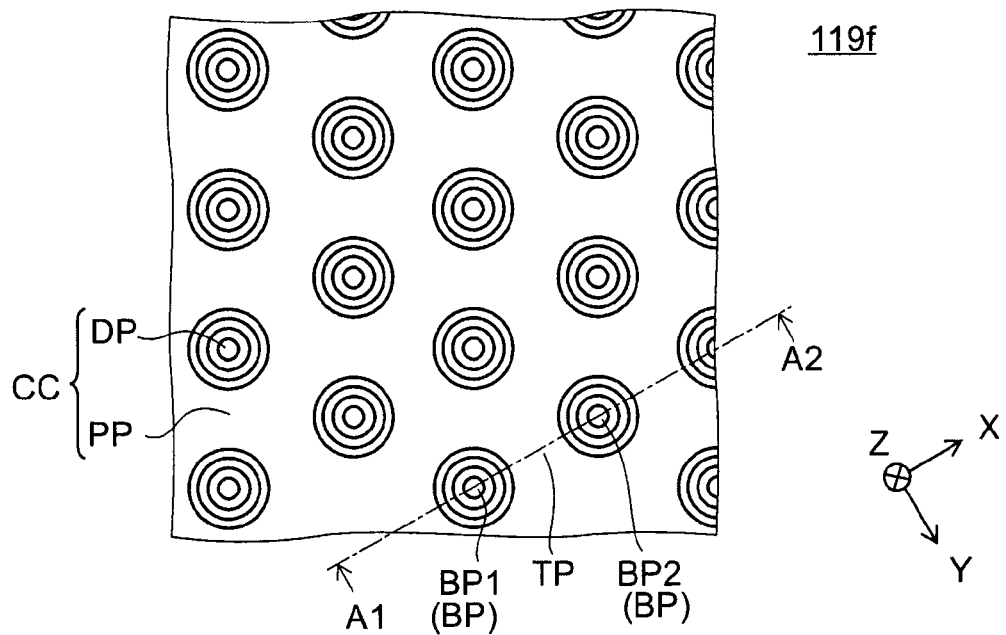
FIG. 17A and FIG. 17B are schematic views showing a semiconductor light emitting device of a reference example.
Figure 17B:
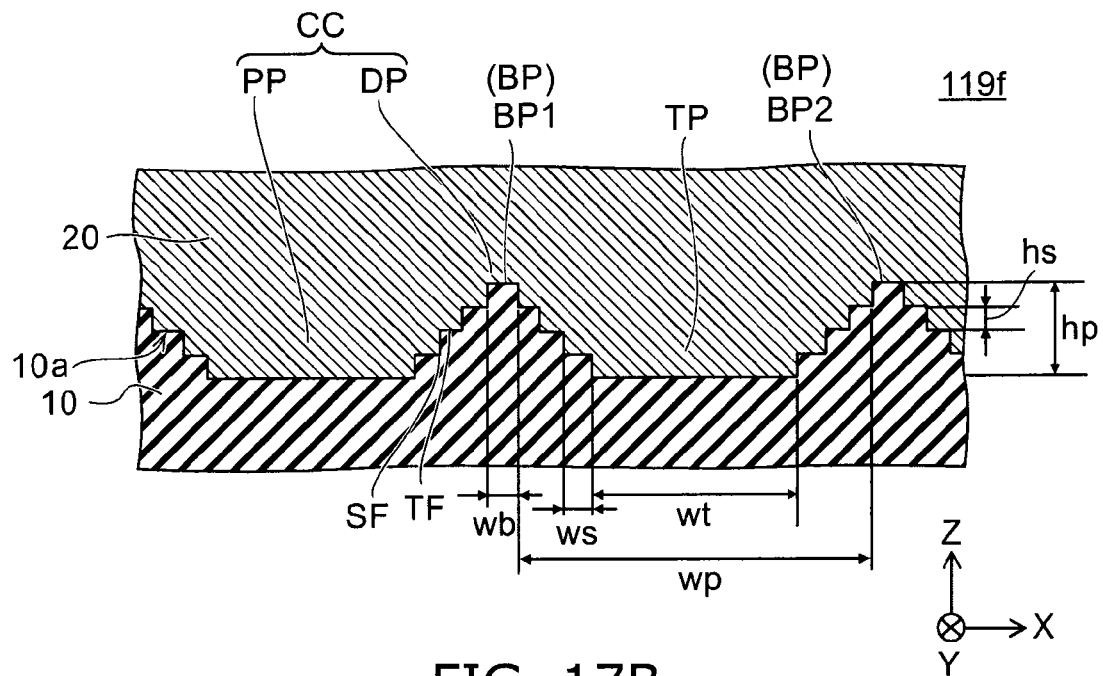

FIG. 17A and FIG. 17B are schematic views illustrating the configuration of a semiconductor light emitting device of a reference example.

As shown in FIG. 17A and FIG. 17B, in the semiconductor light emitting device 119f of the sixth reference example, the depressions DP are arranged with a larger interval than the semiconductor light emitting device 120 according to the embodiments. The top width wt exceeds four times the step width ws. In the sixth reference example, therefore, the efficiency of light extraction is lower at the top portion TP.

If, on the contrary, the width of the bottom portion BP of the depression DP is large (for example, if it exceeds four times the step width ws), the efficiency of light extraction is lower at the bottom portion BP.

In the embodiment, on the contrary, the width (the top width wt and the bottom width wb) of the surface perpendicular to the Z-axis direction is set equal to or smaller than a certain value (not exceeding four times the width of the terrace face TF). Accordingly, there is no degradation of the light extraction efficiency at both the bottom portion BP and the top portion TP. Therefore, a high light extraction efficiency can be obtained.

In the following, the result of an analysis with regard to the relation between the top width wt and the bottom width wb, and the light extraction efficiency will be described.

In the analysis, a simulation of the light extraction efficiency has been performed, varying the top width wt of the top portion TP in the configuration illustrated in FIG. 16A and FIG. 16B. The planar shape of the depression DP is circular, when seen in the Z-axis direction. The step height is 0.4 μm and the irregularity height hp is 2 μm. In other words, the side face SF of the irregularity CC has five processes. The bottom width wb of the bottom portion BP (width of the top of the protrusion of the substrate 10) is 0.76 μm and the step width ws is 0.5 μm.

Figure 18:
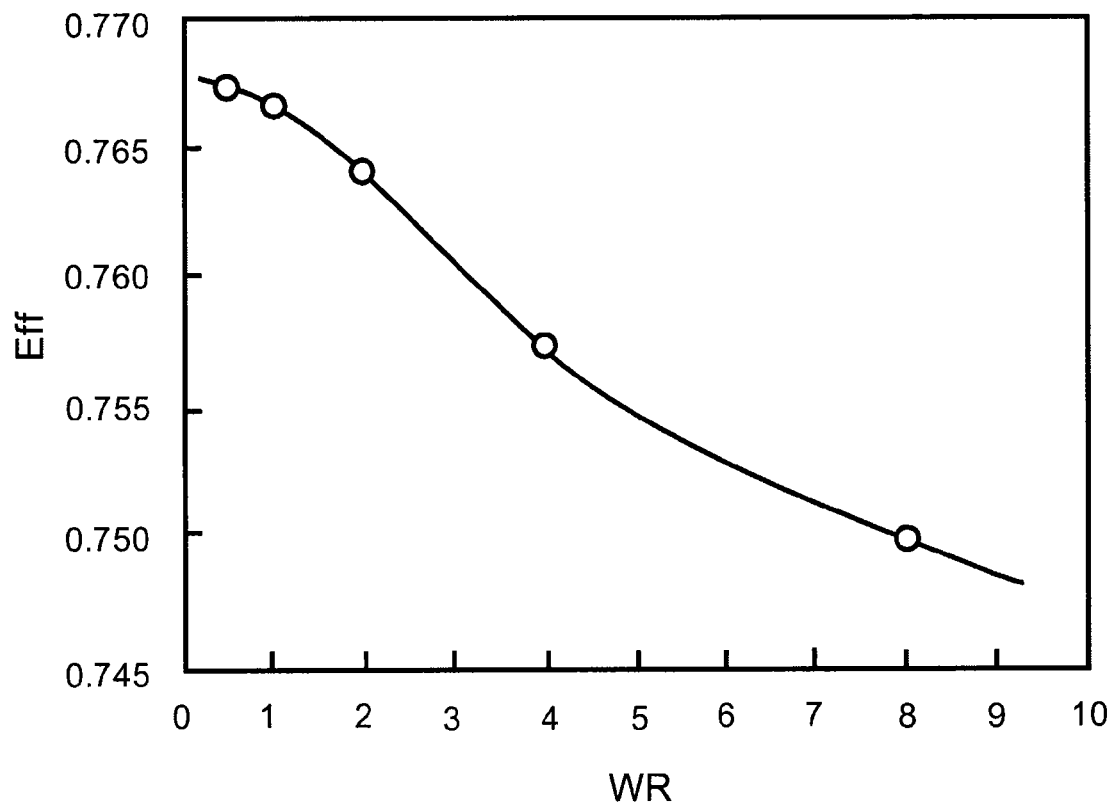
FIG. 18 is a graph showing the characteristic of the semiconductor light emitting device.

FIG. 18 is a graph illustrating the characteristic of the semiconductor light emitting device.

In other words, the horizontal axis of the drawing is the ratio of the top width wt to the step width ws (width ratio WR=wt/ws). The vertical axis is the light extraction efficiency Eff. In FIG. 18, WR=1 corresponds to the top width wt being 0.5 μm, WR=2 corresponds to the top width wt being 1 μm, and WR=4 corresponds to the top width wt being 2 μm.

As shown in FIG. 18, the light extraction efficiency becomes high when the width ratio WR is small. In other words, the light extraction efficiency drops when either the width that is the bottom portion BP or the top portion TP is wide, as described with regard to the sixth reference example. The light extraction efficiency is enhanced by making the bottom portion BP and the top portion TP narrower.

As shown in FIG. 18, the degree of rise of the light extraction efficiency Eff along with decrease of the width ratio WR is gradual for the width ratio WR in the range of 4 to 8. On the contrary, the degree of rise of the light extraction efficiency Eff along with decrease of the width ratio WR becomes larger for the width ratio WR below 4.

In the embodiment, therefore, the width ratio WR is set equal to or smaller than 4. In other words, the top width wt and the bottom width wb are set equal to or smaller than four times the width of the terrace face TF (step width ws). Accordingly, a high light extraction efficiency can be obtained.

As shown in FIG. 18, variation of the light extraction efficiency Eff along with decrease of the width ratio WR is particularly steep for the width ratio WR in the range of 2 to 4. Therefore, it is desirable that the top width wt and the bottom width wb do not exceed twice the width of the terrace face TF (step width ws). Accordingly, a higher light extraction efficiency can be obtained.

It is further desirable that the top width wt and the bottom width wb do not exceed the width of the terrace face TF (step width ws). Accordingly, a higher light extraction efficiency can be obtained.

As recited above, a high light extraction efficiency can be obtained when the top width wt and the bottom width wb do not exceed four times the width of the terrace face TF (step width ws).

Additionally, in the embodiment, it is desirable that the top width wt and the bottom width wb are set equal to or smaller than 2 μm (corresponding to WR=4). It is further desirable that the top width wt and the bottom width wb are set equal to or smaller than 1 μm (corresponding to WR=2). It is still further desirable that the top width wt and the bottom width wb are set equal to or smaller than 0.5 μm (corresponding to WR=1).

Figure 19A:
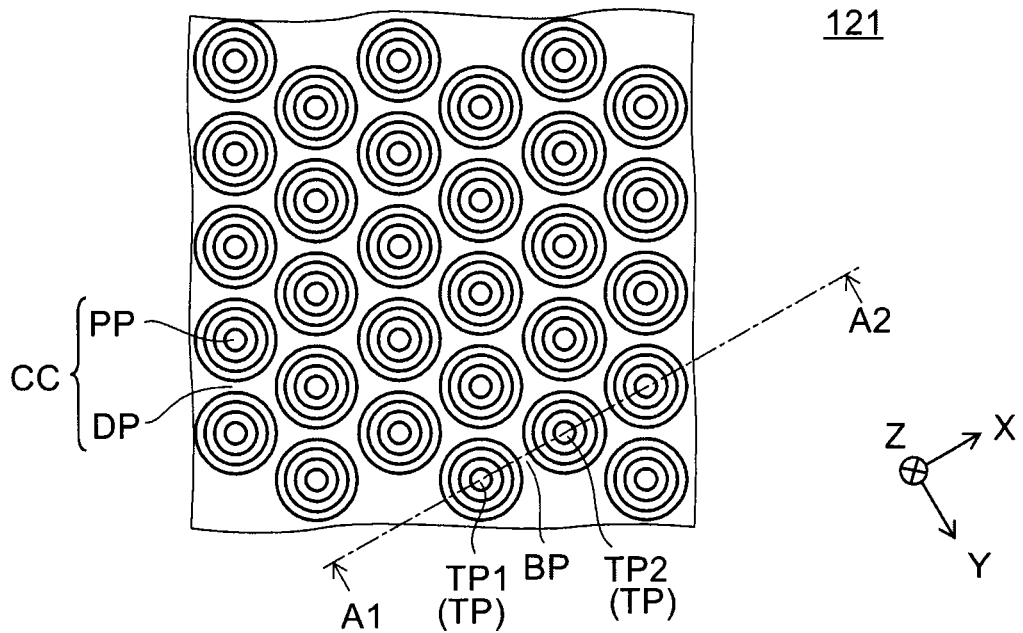
FIG. 19A and FIG. 19B are schematic views showing another semiconductor light emitting device according to the second embodiment.
Figure 19B:
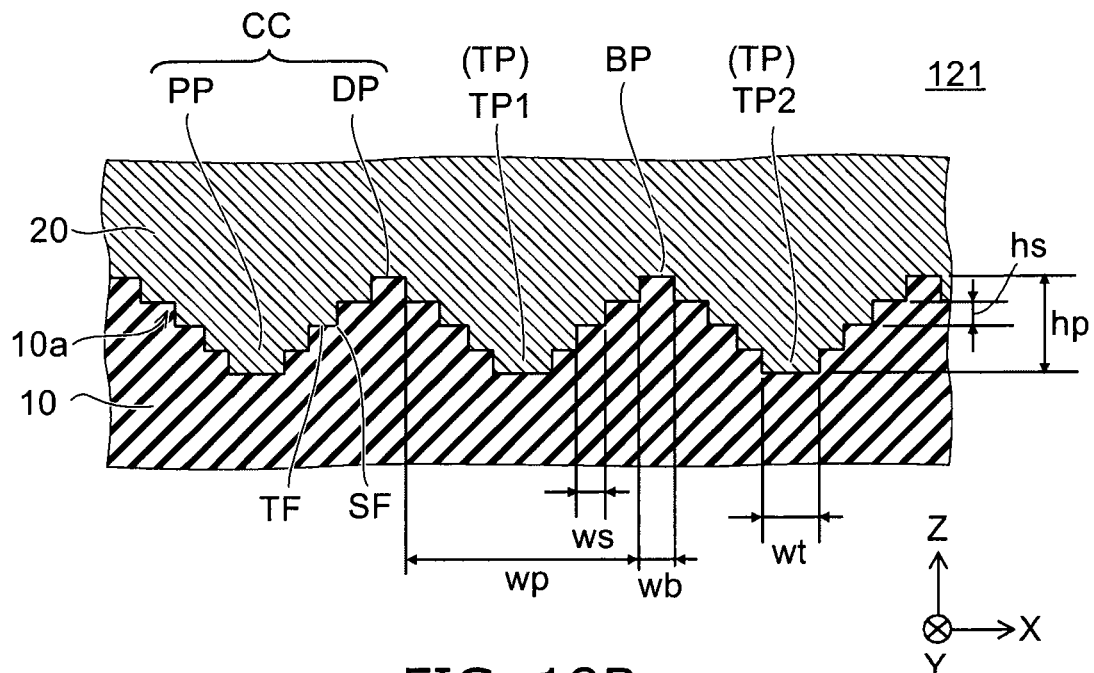

FIG. 19A and FIG. 19B are schematic views illustrating the configuration of another semiconductor light emitting device according to the second embodiment.

FIG. 19A is a plan view of the first major surface 10a of the first semiconductor layer 20 of another semiconductor light emitting device 121 according to the embodiments, when seen in the Z-axis direction. If the substrate 10 is provided in semiconductor light emitting device 121, FIG. 19A corresponds to a plan view seeing the first major surface 10a through the substrate 10. FIG. 19B is a cross-sectional view taken along the line A1-A2 of FIG. 19A.

Although not illustrated in the drawings, the semiconductor light emitting device 121 includes the first semiconductor layer 20 including an n-type semiconductor layer, the second semiconductor layer 50 including a p-type semiconductor layer, and the light emitting part 40 provided between the first semiconductor layer 20 and the second semiconductor layer 50, and including the barrier layers BL and the well layer WL provided between the barrier layers BL.

As shown in FIG. 19A and FIG. 19B, the first semiconductor layer 20 has the irregularity CC provided on the first major surface 10a of the first semiconductor layer 20 on the opposite side to the light emitting part 40. The irregularity CC has the step-like side face SF including the terrace faces TF which are perpendicular to the Z-axis direction.

In the specific example, the depression DP is continuous in the first major surface 10a. In other words, a plurality of protrusions PP are provided in a region of the continuous depression DP in the first major surface 10a.

In other words, the irregularity CC has a plurality of top portions TP when the first major surface 10a is cut in a plane which is parallel with the Z-axis direction. The width of the top portions TP in the X-axis direction connecting the two top portions TP nearest to each other among the top portions TP, and the width of the bottom portion BP of the irregularity CC in the X-axis direction do not exceed four times the width of the terrace faces TF in the X-axis direction.

In other words, the top width wt and the bottom width wb are set equal to or smaller than a certain value (not exceeding four times the width of the terrace face TF) also in the semiconductor light emitting device 121. Accordingly, a semiconductor light emitting device having a high crystal quality and a high light extraction can be obtained.

It is also desirable in the case that the top width wt and for the bottom width wb do not exceed twice the width of the terrace face TF (step width ws). It is further desirable that the settings of the top width wt and the bottom width wb do not exceed the width of the terrace face TF (step width ws).

It is desirable in the semiconductor light emitting device according to the embodiments (e.g., the semiconductor light emitting device 120 and the semiconductor light emitting device 121) that the step height of each of the terrace faces TF along the Z-axis (step height hs) does not exceed the peak wavelength of the light emitted from the light emitting part 40. If the step height hs is larger than the peak wavelength, the effect of enhancing the light extraction efficiency may decrease.

It is desirable that the step height of each of the terrace faces along the Z-axis TF (step height hs) is 100 nm or more and 500 nm or less. Accordingly, semiconductor light emitting device having a high crystal quality and a high light extraction efficiency can be easily obtained.

It is desirable that the width of each of the terrace faces along the X-axis TF (step width ws) does not exceed the peak wavelength of the light emitted from the light emitting part 40. If the step width ws is larger than the peak wavelength, the effect of enhancing the light extraction efficiency may decrease.

It is desirable that the width of each of the terrace faces along the X-axis TF (step width ws) is 100 nm or more and 500 nm or less. Accordingly, a semiconductor light emitting device having a high crystal quality and a high light extraction efficiency can be easily obtained.

In the embodiment, it is desirable that the top portion TP and the level difference (irregularity height hp) in the Z-axis direction between the bottom portion BP are larger than the peak wavelength of the light emitted from the light emitting part 40. When the irregularity height hp does not exceed the peak wavelength, the light extraction efficiency may drop.

It is desirable that the level difference between the top portion TP and the bottom portion BP in the Z-axis direction (irregularity height hp) is 1 μm or more and 3 μm or less. Accordingly, a semiconductor light emitting device having a high crystal quality and a high light extraction efficiency can be easily obtained.

Figure 20A:
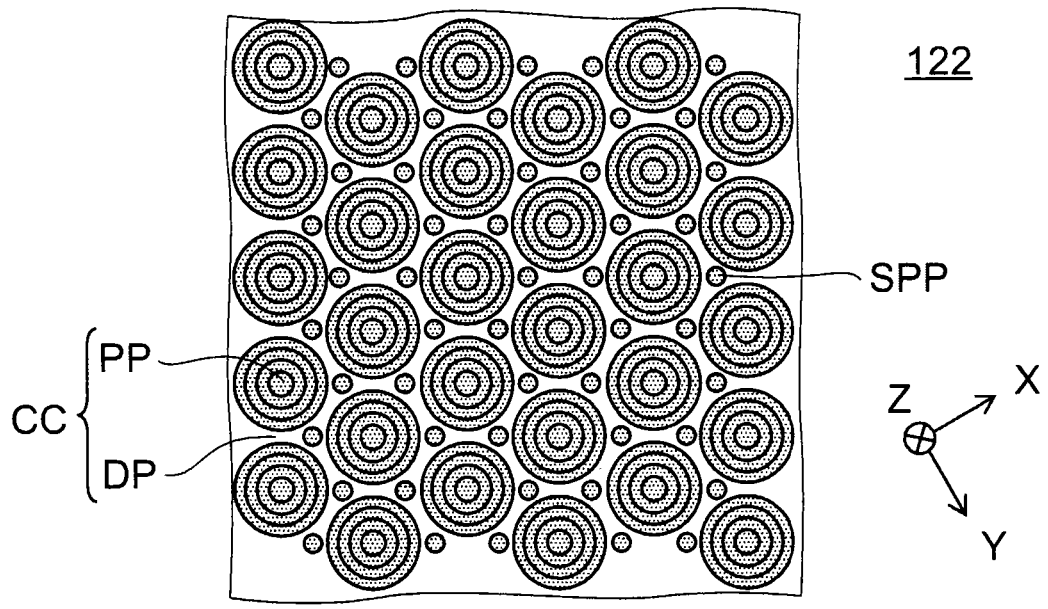
FIG. 20A and FIG. 20B are schematic plan views showing other semiconductor light emitting devices according to the second embodiment.
Figure 20B:
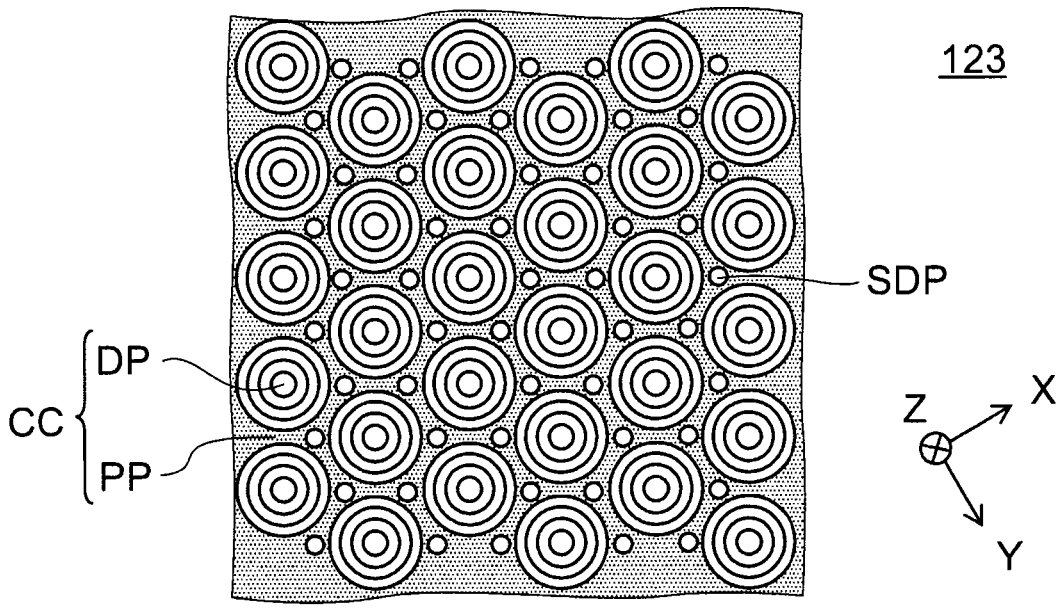

FIG. 20A and FIG. 20B are schematic plan views illustrating the configuration of other semiconductor light emitting devices according to the second embodiment.

Figure 21A:
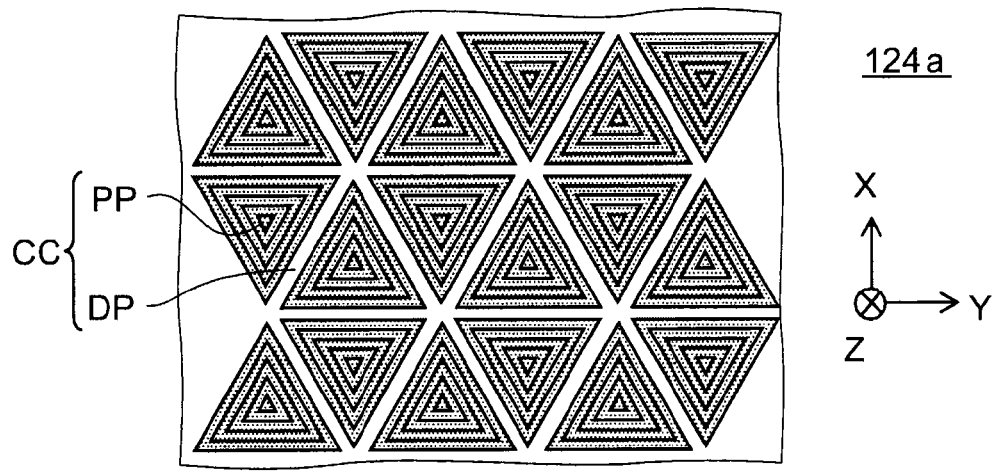
FIG. 21A to FIG. 21C are schematic plan views showing other semiconductor light emitting devices according to the second embodiment.
Figure 21B:
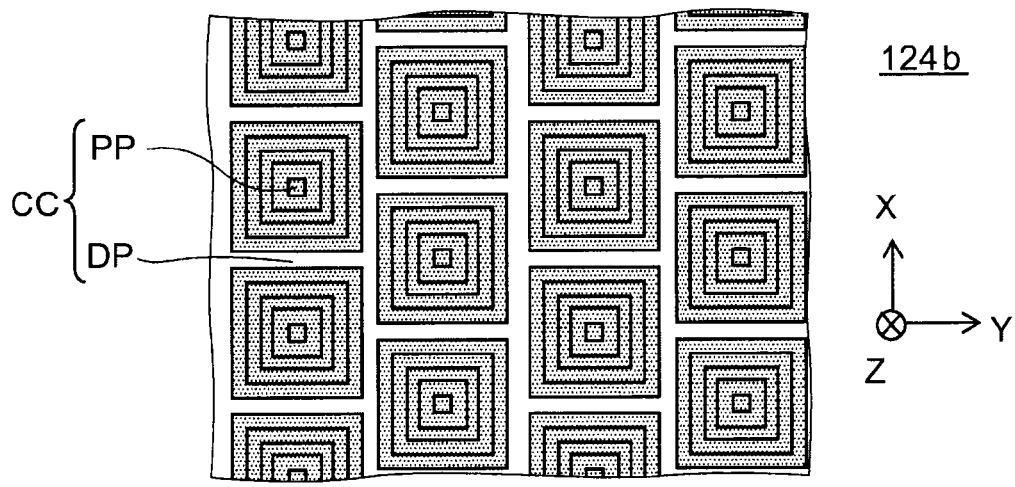
Figure 21C:
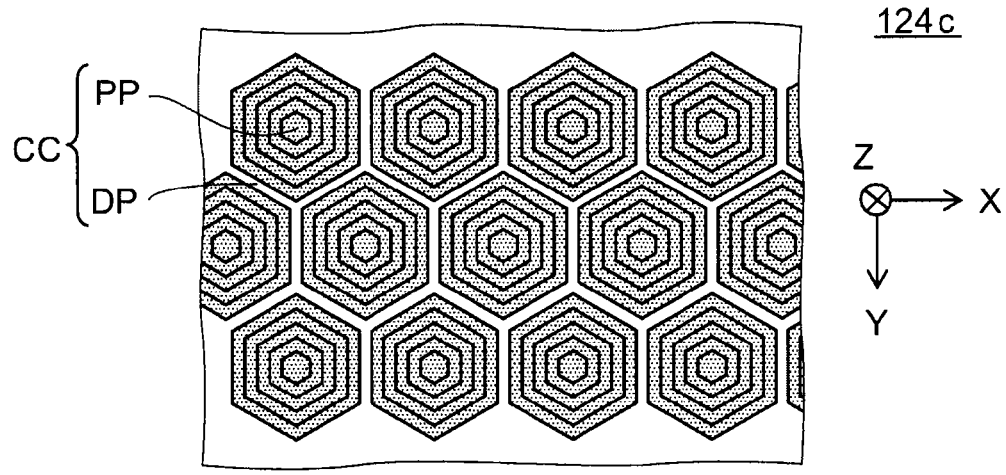

FIG. 21A to FIG. 21C are schematic plan views illustrating the configuration of other semiconductor light emitting devices according to the second embodiment.

Figure 22A:
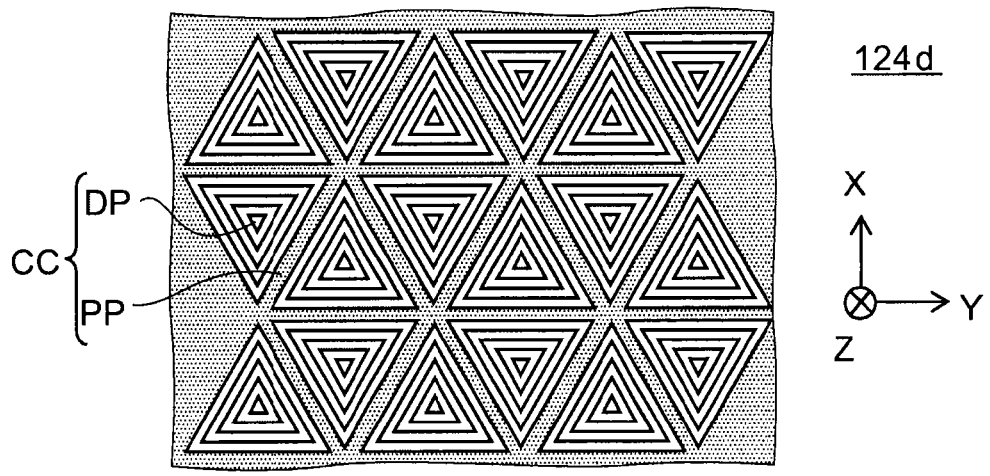
FIG. 22A to FIG. 22C are schematic plan views showing other semiconductor light emitting devices according to the second embodiment.
Figure 22B:
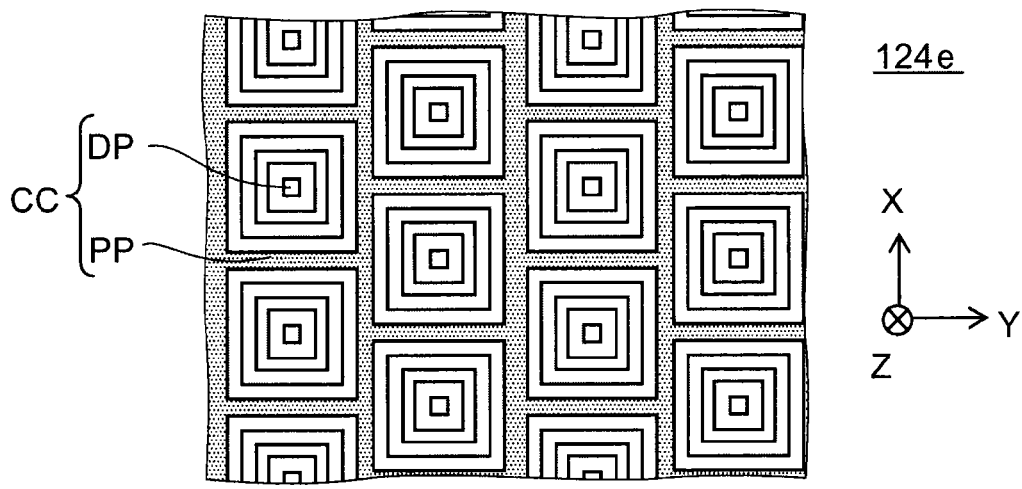
Figure 22C:
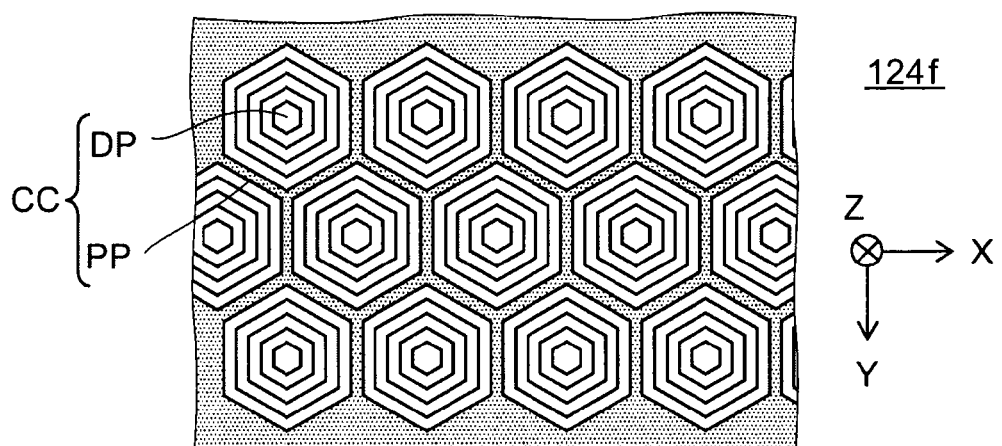

FIG. 22A to FIG. 22C are schematic plan views illustrating the configuration of other semiconductor light emitting devices according to the second embodiment.

These drawings are plan views of the first major surface 10*a* of the first semiconductor layer 20, when seen in the Z-axis direction. If the substrate 10 is provided in the semiconductor light emitting device 120, the drawings correspond to a plan view seeing the first major surface 10*a* through the substrate 10.

As shown in FIG. 20A, a continuous depression DP is provided on the first major surface 10*a* in a semiconductor light emitting device 122. A plurality of protrusions PP is provided thereon. The planar shape of the protrusions PP is circular. The centers of the protrusions PP are provided at respective positions of the centers and vertices of regular hexagons. A small protrusion SPP is provided on the depression DP between three adjacent protrusions PP. Accordingly, the area of the planar part is reduced in the depression DP. Consequently, the light extraction efficiency is further enhanced.

A small depression may also be provided on the depression DP between the three adjacent protrusions PP.

As shown in FIG. 20B, a continuous protrusion PP is provided on the first major surface 10*a* in a semiconductor light emitting device 123. A plurality of depressions DP is provided thereon. The planar shape of the depressions DP is circular. The centers of the depressions DP are provided at respective positions of the centers and vertices of regular hexagons. A small depression SDP is provided on the protrusion PP between three adjacent depressions DP. Accordingly, the area of the planar part is reduced in the protrusion PP. Consequently, the light extraction efficiency is further enhanced.

A small protrusion may also be provided on the depression DP between the three adjacent depressions DP.

As shown in FIG. 21A, a continuous depression DP and a plurality of protrusions PP are provided in a semiconductor light emitting device 124*a*. The planar shape of the protrusions PP is triangular.

As shown in FIG. 21B, a continuous depression DP and a plurality of protrusions PP are provided in a semiconductor light emitting device 124*b*. The planar shape of the protrusions PP is quadrangular.

As shown in FIG. 21C, a continuous depression DP and a plurality of protrusions PP are provided in a semiconductor light emitting device 124*c*. The planar shape of the protrusions PP is hexagonal.

As shown in FIG. 22A, a continuous protrusion PP and a plurality of depressions DP are provided in a semiconductor light emitting device 124*d*. The planar shape of the depressions DP is triangular.

As shown in FIG. 22 (*b*), a continuous protrusion PP and a plurality of the depressions DP are provided in a semiconductor light emitting device 124*e*. The planar shape of the depressions DP is quadrangular.

As shown in FIG. 22C, a continuous protrusion PP and a plurality of depressions DP are provided in a semiconductor light emitting device 124*f*. The planar shape of the depressions DP is hexagonal.

As recited above, the shape of at least either the top portion TP or the bottom portion BP when seen from the Z-axis direction may be any of triangular, quadrangular, hexagonal, or circular. Particularly, since the top portion TP and the bottom portion BP can be arranged with a high density when the shape of at least either the top portion TP or the bottom portion BP seen from the Z-axis direction is triangular, quadrangular, or hexagonal, the light extraction efficiency becomes higher.

As recited above, the planar shape of the depressions DP and the protrusions PP may be transformed in a variety of manners. Arrangement of the depressions DP and the protrusions PP is also arbitrary.

The semiconductor light emitting device according to the embodiments may further include the substrate 10. The first semiconductor layer 20 is provided between the substrate 10 and the light emitting part 40. In other words, the first semiconductor layer 20 is formed on the substrate 10 by crystal growth. The refractive index of the substrate 10 is different from refractive index of the first semiconductor layer 20. For example, the refractive index of the substrate 10 is lower than the refractive index of the first semiconductor layer 20.

In the following, an exemplary method for manufacturing the semiconductor light emitting device (e.g., the semiconductor light emitting devices 120 to 123, 124a to 124f) according to the embodiments will be described.

The manufacturing method described below is a method for manufacturing a semiconductor light emitting device comprising the first semiconductor layer 20 including an n-type semiconductor layer, the second semiconductor layer 50 including a p-type semiconductor layer, and the light emitting part 40 provided between the first semiconductor layer 20 and the second semiconductor layer 50, and including the barrier layers BL and the well layer WL provided between the barrier layers BL. In the semiconductor light emitting device, the first semiconductor layer 20 has the irregularity CC provided on the first major surface 10a of the first semiconductor layer 20 on the opposite side to the light emitting part 40. The irregularity CC has a step-like side face SF including the terrace faces TF which are perpendicular to the Z-axis direction.

Figure 23:
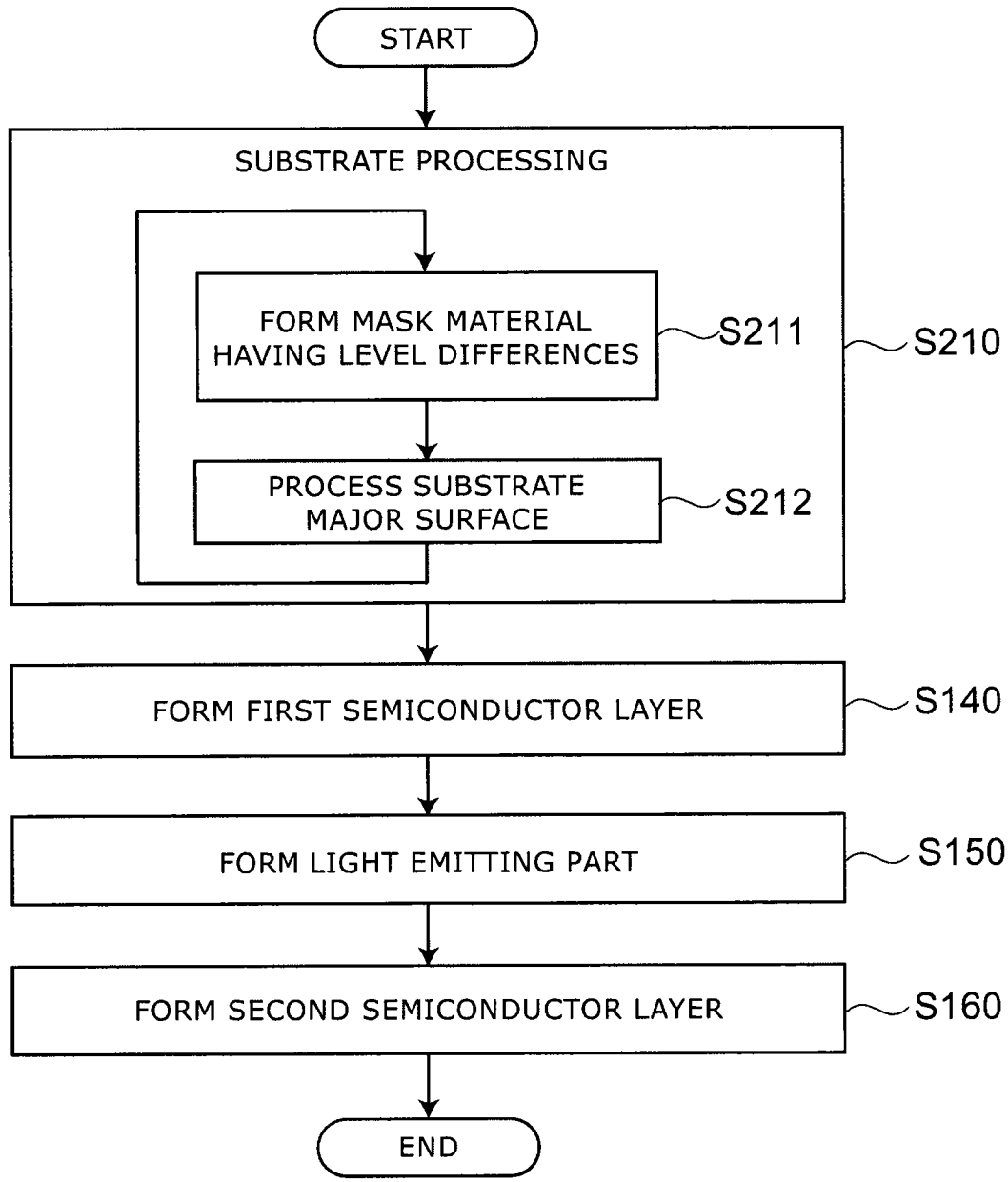
FIG. 23 is a flow chart showing a method for manufacturing the semiconductor light emitting device according to the second embodiment.

FIG. 23 is a flow chart illustrating a method for manufacturing the semiconductor light emitting device according to the second embodiment.

FIG. 24A to FIG. 24E are schematic cross-sectional views in order of the processes, illustrating the method for manufacturing the semiconductor light emitting device according to the second embodiment.

As shown in FIG. 23, the manufacturing method has a process of processing the substrate (step S210) and the process of forming the first semiconductor layer 20 (step S140).

The process of processing the substrate includes a process of forming a mask material (step S211), and a process of processing the substrate major surface (step S212).

Figure 24A:
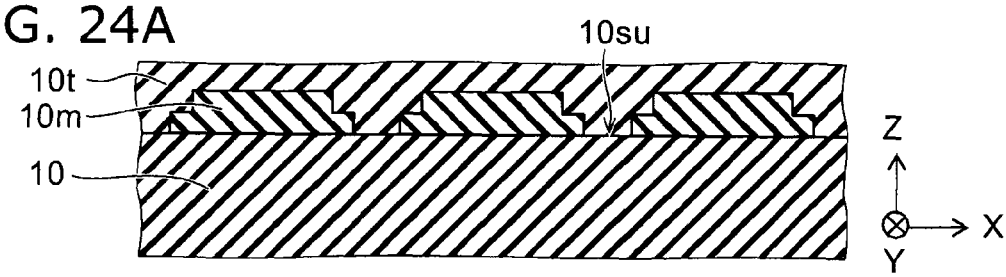
FIG. 24A to FIG. 24E are schematic cross-sectional views in order of the processes, showing the method for manufacturing the semiconductor light emitting device according to the second embodiment.
Figure 24B:
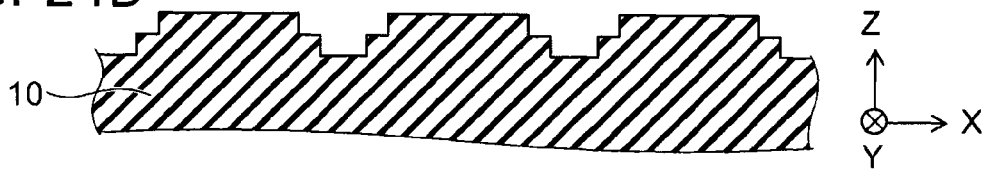

In other words, as shown in FIG. 24A, a mask material 10m having a plurality of the level differences to be the basis of the shape of at least a part of a plurality of terrace faces TF is formed on the major surface of the substrate 10 (the substrate major surface 10su). In the example, imprinting using the template 10t is used to form the mask material 10m. The method of forming the mask material 10m is arbitrary.

As shown in FIG. 24 (b), the substrate major surface 10su is processed using the mask material 10m as a mask.

Figure 24C:
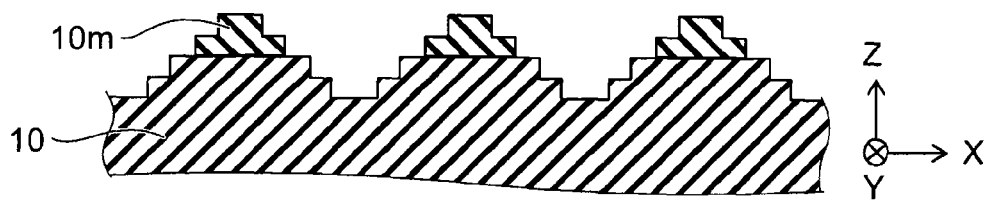

As shown in FIG. 24C, the mask material 10m having a plurality of level differences to be the basis of the shape of at least a part of a plurality of terrace faces TF is further formed on the substrate major surface 10su. The size of the mask material 10m in the occasion is smaller than the size of the first (previous) mask material 10m.

Figure 24D:
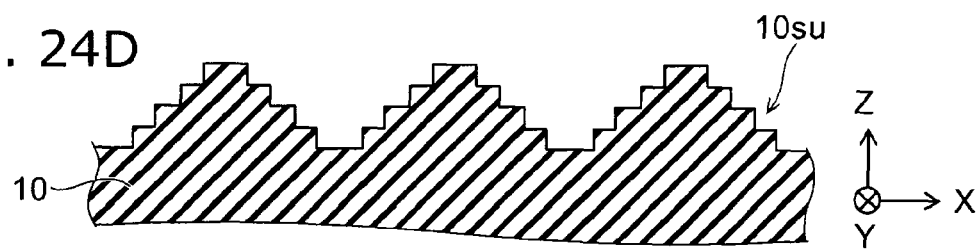

As shown in FIG. 24D, the substrate major surface 10su is processed using the mask material 10m as a mask.

As shown in FIG. 23, processes S211 and S212 can be repeated multiple times. Accordingly, an irregularity is formed on the substrate major surface 10su. The shape of the irregularity corresponds to the shape of the irregularity CC of the first semiconductor layer 20 having the step-like side face SF including the terrace faces TF which are perpendicular to the Z-axis direction.

Figure 24E:
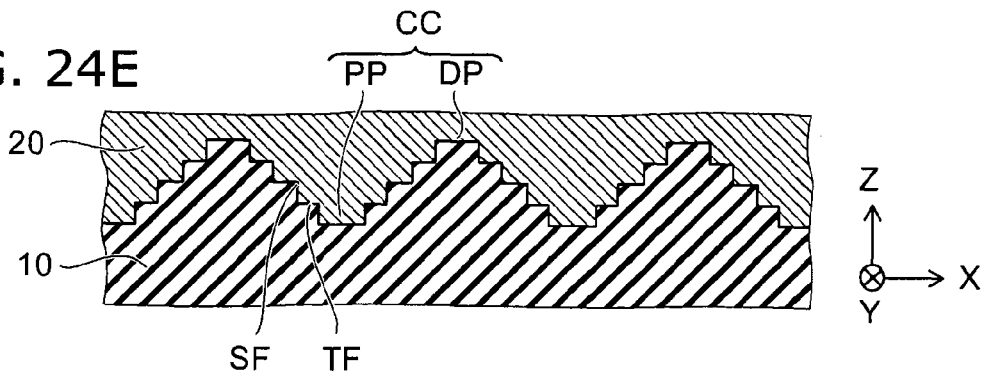

As shown in FIGS. 24E and 23, the first semiconductor layer 20 is formed on the substrate major surface 10su (step S140).

Accordingly, the irregularity CC reflecting the shape of the irregularity of the substrate 10 is formed on the first semiconductor layer 20. The irregularity CC of the first semiconductor layer 20 has the step-like side face SF including the terrace faces TF which are perpendicular to the Z-axis direction.

Subsequently, as shown in FIG. 23, the light emitting part 40 is formed on the first semiconductor layer 20 (step S150). The second semiconductor layer 50 is formed on the light emitting part 40 (step S160). The n-side electrode 70 and the p-side electrode 80 are then formed to produce the semiconductor light emitting device according to the embodiments. The substrate 10 may be removed in any technically feasible process.

In the manufacturing method according to the embodiments, a semiconductor light emitting device having a high crystal quality and a high light extraction efficiency can be manufactured with a good productivity.

Performing substrate fabrication (step S210) in the manufacturing method includes repeatedly forming the mask material 10m (step S211) and processing the substrate major surface 10su (step S212).

As described above, formation of the mask material 10m may include formation of the mask material 10m by imprinting which uses a model to be the basis of the shape of the level difference of the mask material 10m.

Figure 25:
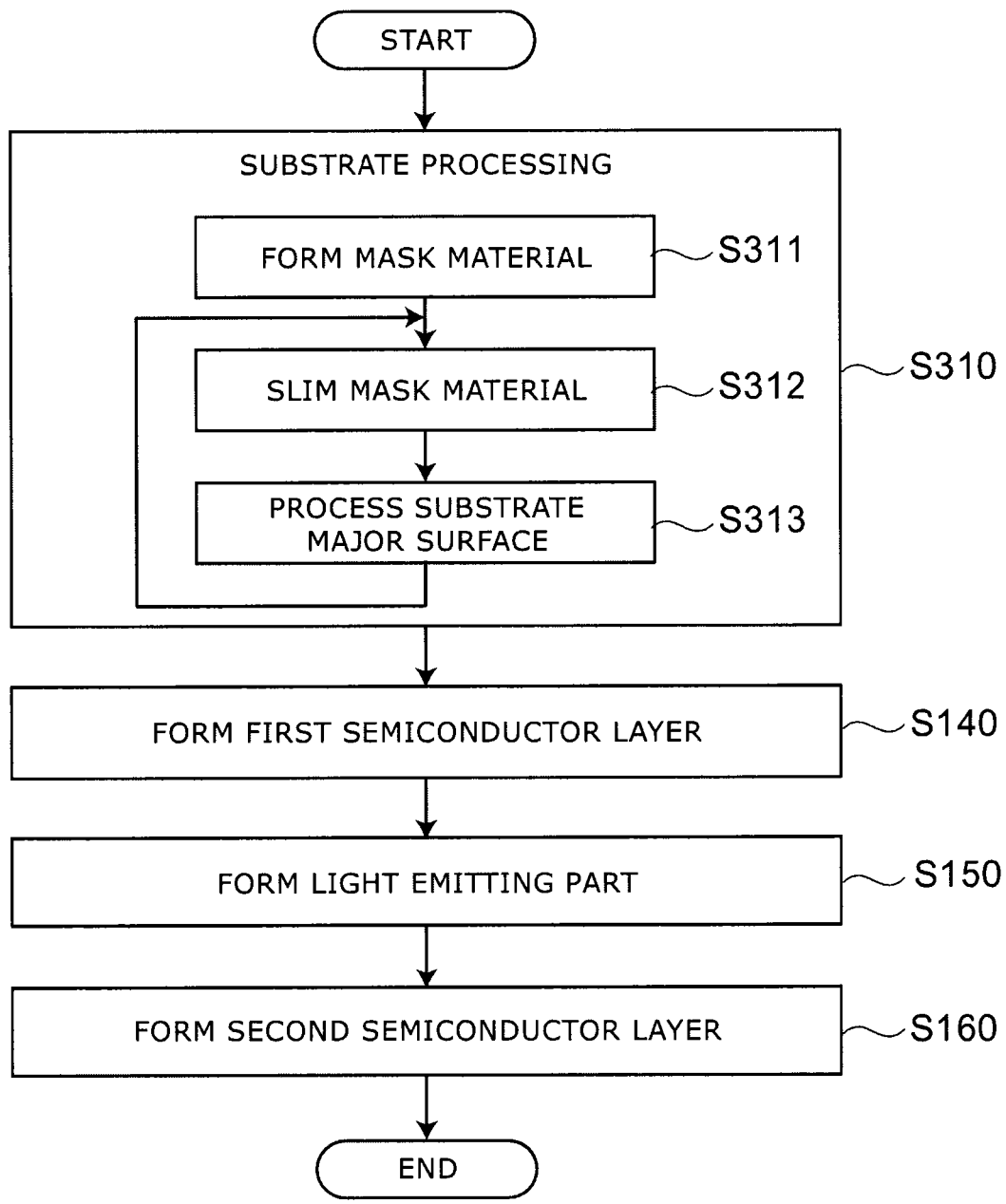
FIG. 25 is a flow chart showing another method for manufacturing the semiconductor light emitting device according to the second embodiment.

FIG. 25 is a flow chart illustrating another method for manufacturing the semiconductor light emitting device according to the second embodiment.

FIG. 26A to FIG. 26F are schematic cross-sectional views in order of the processes, illustrating another method for manufacturing the semiconductor light emitting device according to the second embodiment.

As shown in FIG. 25, the manufacturing method has a process of processing the substrate (step S310) and the process of forming the first semiconductor layer 20 (step S140).

The process of processing the substrate includes a process of forming the mask material on the substrate major surface 10su of the substrate 10 (step S311). The process of processing the substrate includes a process of repeating slimming of the mask material (step S312) and processing of the substrate major surface 10su using the slimmed mask material as a mask (step S313).

Figure 26A:
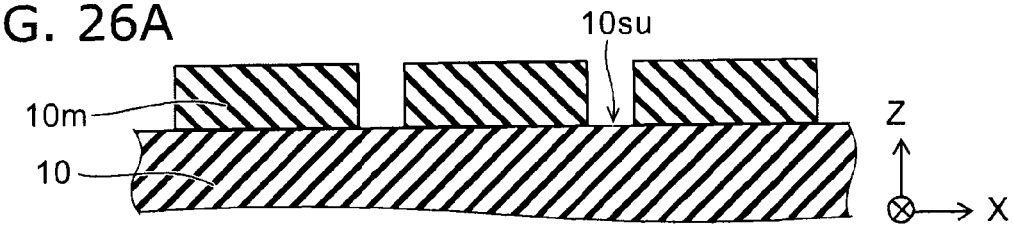
FIG. 26A to FIG. 26F are schematic cross-sectional views in order of the processes, showing another method for manufacturing the semiconductor light emitting device according to the second embodiment.

In other words, the mask material 10m is formed on the substrate major surface 10su of the substrate 10 (step S311), as shown in FIG. 26A. The method of forming the mask material 10m is arbitrary. In the occasion, slimming may be performed on the mask material 10m.

Figure 26B:
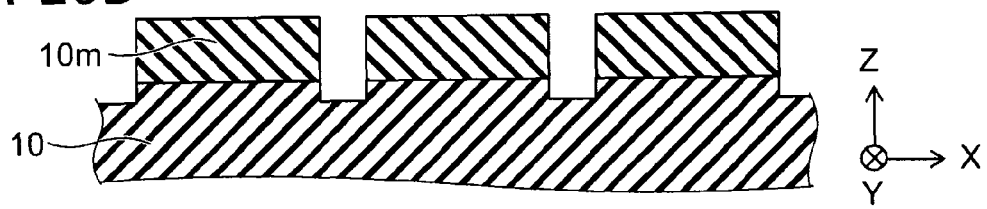

The substrate major surface 10su is processed using the mask material 10m as a mask, as shown in FIG. 26B.

Figure 26C:
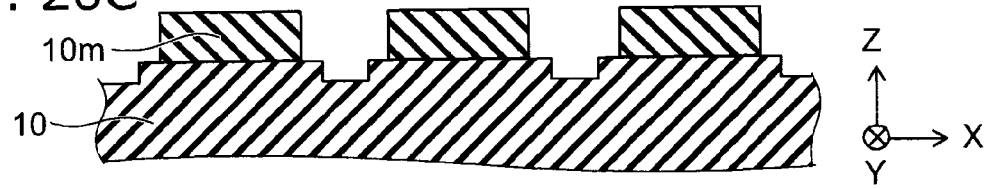

The mask material 10m is then slimmed (step S312), as shown in FIG. 26C.

Figure 26D:
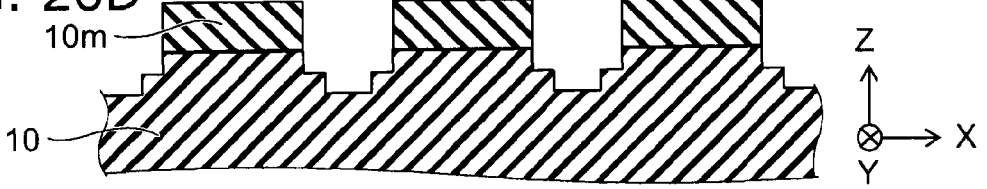
Figure 26E:
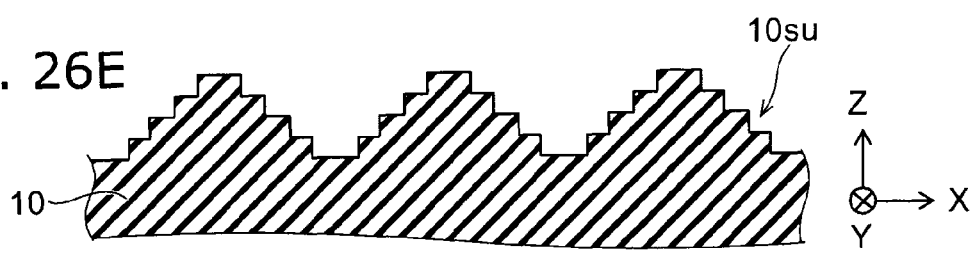

The substrate major surface 10su is processed using the slimmed mask material 10m as a mask (step S313), as shown in FIG. 26D.

The above-mentioned steps S312 and S313 are repeatedly performed.

Accordingly, an irregularity corresponding to the shape of the irregularity CC of the first semiconductor layer 20 is formed on the substrate major surface 10su, as shown in FIG. 26 (e).

Figure 26F:
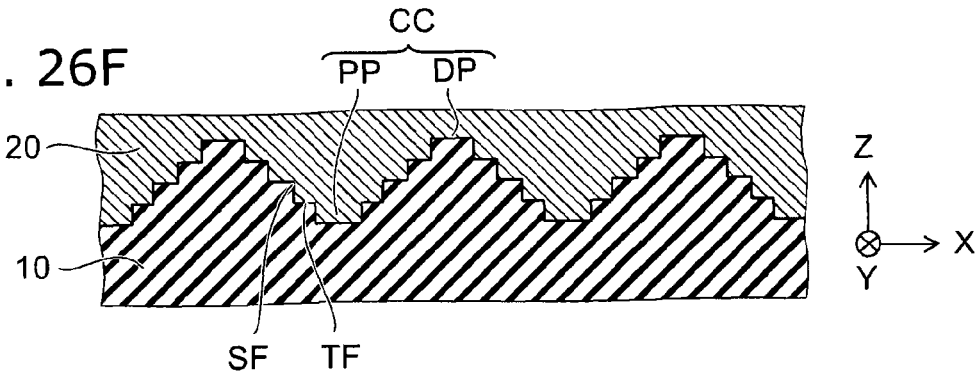

The first semiconductor layer 20 is then formed on the substrate major surface 10su (step S140), as shown in FIGS. 26F and 25.

Accordingly, the irregularity CC reflecting the shape of the irregularity of the substrate 10 is formed on the first semiconductor layer 20. The irregularity CC of the first semiconductor layer 20 has the step-like side face SF including the terrace faces TF which are perpendicular to the Z-axis direction.

Subsequently, as shown in FIG. 25, the light emitting part 40 is formed on the first semiconductor layer 20 (step S150). The second semiconductor layer 50 is formed on the light emitting part 40 (step S160). The n-side electrode 70 and the p-side electrode 80 are then formed to produce the semiconductor light emitting device according to the embodiments. The substrate 10 may be removed in any technically feasible process.

In the manufacturing method according to the embodiments, a semiconductor light emitting device having a high crystal quality and a high light extraction efficiency can be manufactured with a good productivity.

Figure 27:
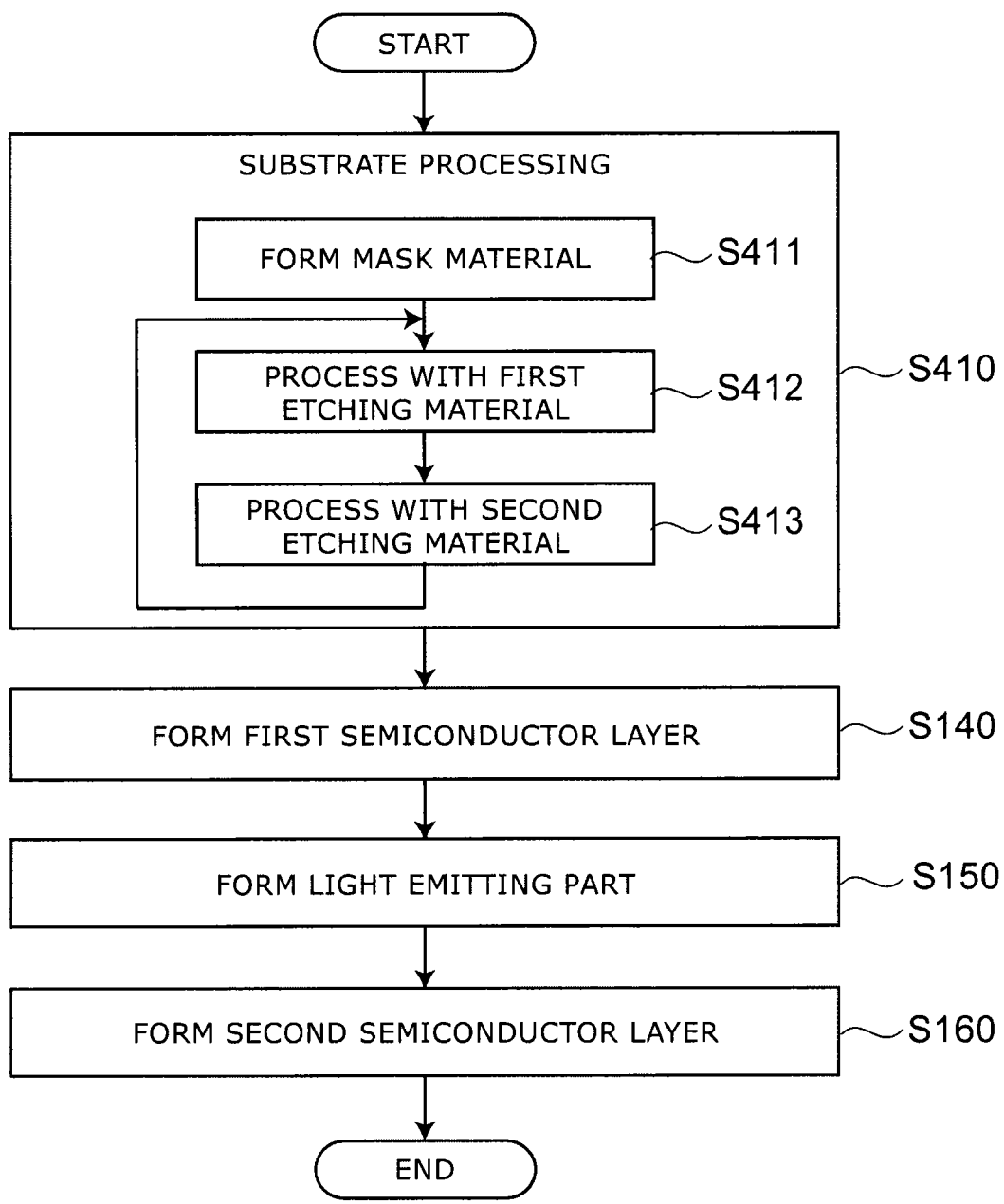
FIG. 27 is a flow chart showing another method for manufacturing the semiconductor light emitting device according to the second embodiment.

FIG. 27 is a flow chart illustrating another method for manufacturing the semiconductor light emitting device according to the second embodiment.

FIG. 28A to FIG. 28F are schematic cross-sectional views in order of the processes, illustrating another method for manufacturing the semiconductor light emitting device according to the second embodiment.

As shown in FIG. 27, the manufacturing method has a process of processing the substrate (step S410) and the process of forming the first semiconductor layer 20 (step S140).

The process of processing the substrate includes a process of forming the mask material (step S411), a process of processing with a first etching material (step S412), and a process of processing with a second etching material (step S413). For example, steps S412 and S413 are repeatedly performed.

Figure 28A:
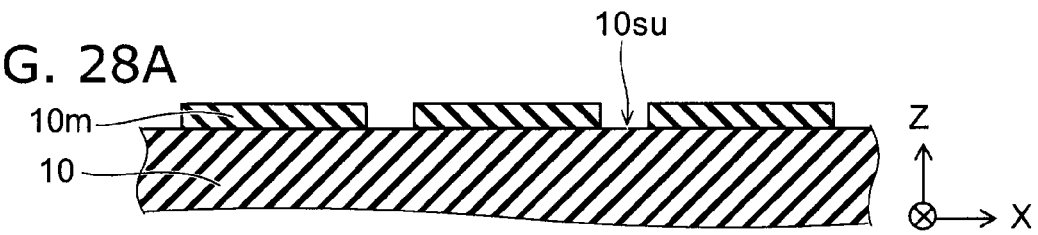
FIG. 28A to FIG. 28F are schematic cross-sectional views in the order of processing, showing another method for manufacturing the semiconductor light emitting device according to the second embodiment.

For example, the mask material 10*m* having a pattern shape reflecting the shape of the irregularity CC is formed on the substrate major surface 10*su* of the substrate 10, as shown in FIG. 28A.

Figure 28B:
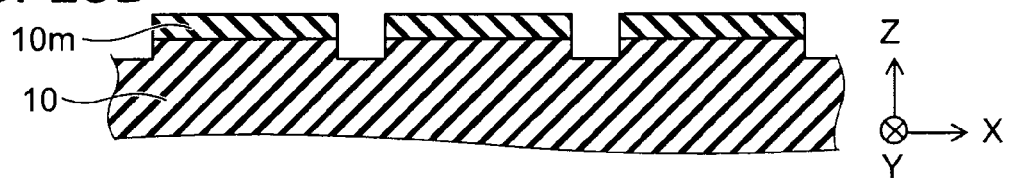

As shown in FIG. 28B, the substrate major surface 10*su* is processed with the first etching material, using the mask material 10*m* as a mask. The etching speed in the Z-axis direction of the first etching material is higher than the etching speed in the direction perpendicular to the Z-axis direction of the first etching material. Accordingly, the substrate major surface 10*su* is processed into a shape conforming to the shape of the mask material 10*m*. In other words, an irregularity is formed on the substrate 10.

Figure 28C:
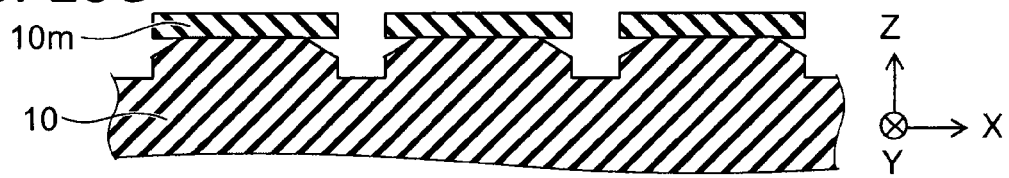

The substrate major surface 10*su* is processed with the second etching material using the mask material 10*m* as a mask, as shown in FIG. 28C. The etching speed in the Z-axis direction of the second etching material is lower than the etching speed in the direction perpendicular to the Z-axis direction of the second etching material. Accordingly, the substrate 10 is etched in a direction perpendicular to the Z-axis direction (horizontal direction). In other words, the side face of the irregularity formed on the substrate 10 is etched.

Figure 28D:
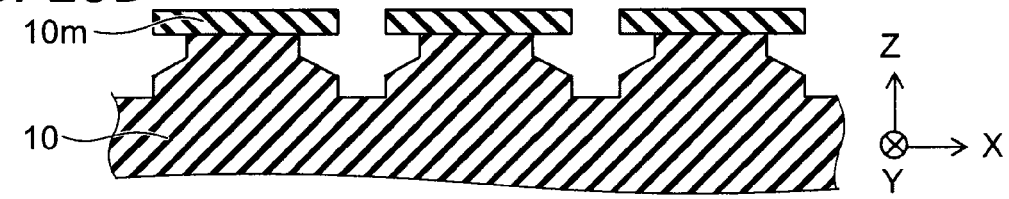

As shown in FIG. 28D, the substrate major surface 10*su* is processed with the first etching material, using the mask material 10*m* as a mask. Accordingly, the second level of the irregularity is formed on the substrate 10.

Figure 28E:
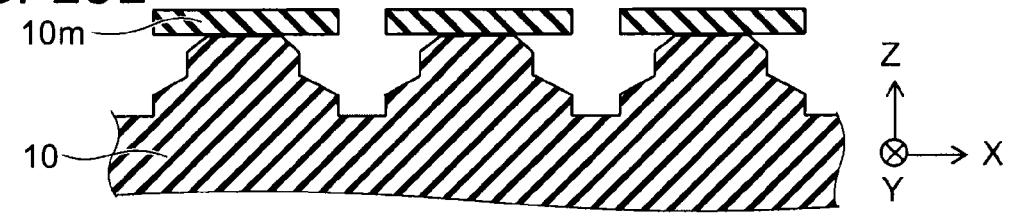
Figure 28F:
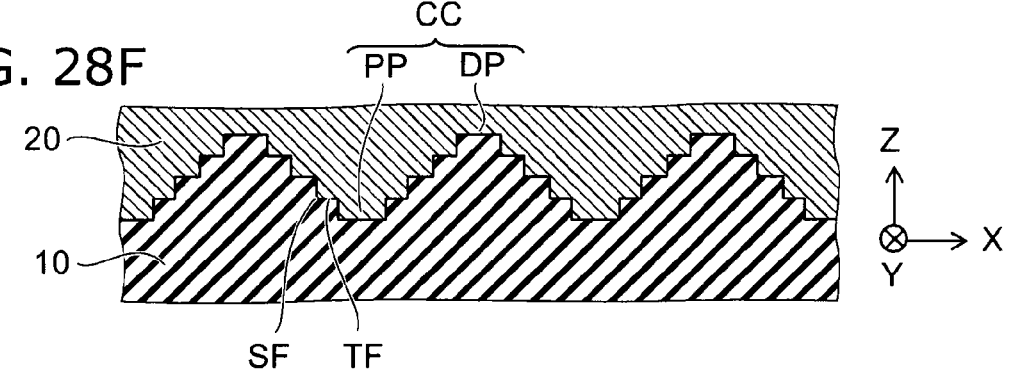

As shown in FIG. 28E, the substrate major surface 10*su* is processed with the second etching material, using the mask material 10*m* as a mask. Accordingly, the side face of formed irregularity is etched on the substrate 10 thereby.

The above process is repeated. Accordingly, an irregularity corresponding to shape of the irregularity CC of the first semiconductor layer 20 is formed on the substrate major surface 10*su*. Anisotropic etching may be further performed on the substrate major surface 10*su* as necessary, after having removed the mask material 10*m*.

The first semiconductor layer 20 is then formed on the substrate major surface 10*su* as shown in FIGS. 28E and 27 (step S140).

Accordingly, the irregularity CC reflecting the shape of the irregularity of the substrate 10 is formed on the first semiconductor layer 20. The irregularity CC of the first semiconductor layer 20 has the step-like side face SF including the terrace faces TF which are perpendicular to the Z-axis direction.

Subsequently, as shown in FIG. 27, the light emitting part 40 is formed on the first semiconductor layer 20 (step S150). The second semiconductor layer 50 is formed on the light emitting part 40 (step S160). The n-side electrode 70 and the p-side electrode 80 are then formed to produce the semiconductor light emitting device according to the embodiments. The substrate 10 may be removed in any technically feasible process.

In the manufacturing method according to the embodiments, a semiconductor light emitting device having a high crystal quality and a high light extraction efficiency can be manufactured with a good productivity.

As recited above, performing fabrication of the substrate (step S410) in the manufacturing method includes repeatedly performing fabrication with the first etching material (step S412) and fabrication with the second etching material (step S413).

The manufacturing method described referring to FIG. 23 to FIG. 28F allows that the irregularity CC has a plurality of top portions TP when the first major surface 10*a* is cut in a plane which is parallel with the Z-axis direction, and the width of the top portions TP in the X-axis direction connecting the two top portions TP nearest to each other among the top portions TP, and the width of the bottom portion BP of the irregularity CC in the X-axis direction do not exceed four times the width of the terrace faces TF in the X-axis direction In addition, the manufacturing method allows that the irregularity CC has a plurality of bottom portions BP when the first major surface 10*a* is cut in a plane which is parallel with the Z-axis direction, and the width of the bottom portions BP in the X-axis direction connecting the two bottom portions BP nearest to each other among the bottom portions BP, and the width of the top portion TP of the irregularity CC in the X-axis direction do not exceed four times the width of terrace faces TF in the X-axis direction.

Accordingly, a semiconductor light emitting device having a high crystal quality and a high light extraction efficiency can be manufactured with a high efficiency.

Metal-Organic Chemical Vapor Deposition (MOCVD), Metal-Organic Vapor Phase Epitaxy or the like may be used for the growth method of each semiconductor layer in the semiconductor light emitting device according to the embodiments.

According to the embodiments, a semiconductor light emitting device having a high crystal quality and a high light extraction efficiency and a method for manufacturing the same are provided.

In the specification, "nitride semiconductor" includes all compositions of semiconductors of the chemical formula $B_x In_y Al_z Ga_{1-x-y-z} N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to the specific examples. However, the invention is not limited to the specific examples. For example, one skilled in the art may similarly practice the invention by appropriately selecting specific configurations of components included in semiconductor light emitting devices such as the first semiconductor layer, the second semiconductor layer, n-type semiconductor layers, p-type semiconductor layers, light emitting parts, well layers, barrier layers, buffer layers, substrates, electrodes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor light emitting devices and methods for manufacturing the same practicable by an appropriate design modification by one skilled in the art based on the semiconductor light emitting devices and the method for manufacturing the same described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor light emitting device including a first semiconductor layer including an n-type semiconductor layer; a second semiconductor layer including a p-type semiconductor layer; and a light emitting part provided between the first semiconductor layer and the second semiconductor layer, and including a plurality of barrier layers and a well layer provided between the barrier layers, the first semiconductor layer having: a first major surface on an opposite side to the light emitting part, a first irregularity provided on the first major surface and having a bottom face and a top face, and a second irregularity provided on the bottom face and the top face and having a bottom portion and a top portion, the first irregularity having a first level difference between the bottom face and the top face along a first direction from the first semiconductor layer toward the second semiconductor layer; and the second irregularity having a second level difference between the bottom portion and the top portion along the first direction, the second level difference being smaller than the first level difference, the method comprising:

forming a third irregularity serving as a basis of the second irregularity on a substrate major surface of a substrate;

forming a mask material having a pattern shape corresponding to a pattern of the first irregularity on the substrate major surface on which the third irregularity is formed;

processing the substrate major surface using the mask material as a mask to form a fourth irregularity serving as a basis of the first irregularity; and forming the first semiconductor layer on the substrate major surface on which the third irregularity and the fourth irregularity have been formed.

2. The method according to claim 1, wherein
at least one of the first level difference, a width of the bottom face along a direction perpendicular to the first direction, and a width of the top face along the direction perpendicular to the first direction is larger than a peak wavelength of light emitted from the light emitting part.

3. The method according to claim 1, wherein
at least one of the second level difference, a width of the bottom portion along a direction perpendicular to the first direction, and a width of the top portion along the direction perpendicular to the first direction is not more than a peak wavelength of light emitted from the light emitting part.

4. The method according to claim 1, wherein
the first irregurality further has a wall face provided between the bottom face and the top face, and
the wall face is inclined with respect to the first direction.

5. The method according to claim 1, wherein
the first level difference is 1 micrometer or more and 5 micrometers or less.

6. The method according to claim 5, wherein
a width of the bottom face along a direction perpendicular to the first direction and a width of the top face along the direction perpendicular to the first direction are 1 micrometer or more and 5 micrometers or less.

7. The method according to claim 1, wherein
the second level difference is 10 nanometers or more and 500 nanometers or less.

8. The method according to claim 7, wherein
a width of the bottom portion along a direction perpendicular to the first direction and a width of the top portion along the direction perpendicular to the first direction are 10 nanometers or more and 500 nanometers or less.

9. The method according to claim 1, wherein
the second level difference is one-tenth or less than the first level difference.

10. The method according to claim 1, wherein
a width of the bottom portion along a direction perpendicular to the first direction and a width of the top portion along the direction perpendicular to the first direction are one-tenth or less than a width of the bottom face along the direction perpendicular to the first direction and a width of the top face along the direction perpendicular to the first direction.

* * * * *